US009602184B2

(12) United States Patent
Honda et al.

(10) Patent No.: US 9,602,184 B2
(45) Date of Patent: Mar. 21, 2017

(54) WIRELESS COMMUNICATION DEVICE, CONTROL METHOD OF WIRELESS COMMUNICATION DEVICE AND PHASE SHIFTER

(71) Applicant: FUJITSU LIMITED, Kawasaki-shi, Kanagawa (JP)

(72) Inventors: Atsushi Honda, Setagaya (JP); Yoji Ohashi, Fucyu (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/062,023

(22) Filed: Mar. 4, 2016

(65) Prior Publication Data
US 2016/0269091 A1 Sep. 15, 2016

(30) Foreign Application Priority Data
Mar. 10, 2015 (JP) ................................. 2015-047654

(51) Int. Cl.
H04K 1/02 (2006.01)
H04L 25/03 (2006.01)
(Continued)

(52) U.S. Cl.
CPC ............ H04B 7/0667 (2013.01); H01Q 3/26 (2013.01); H03F 1/0277 (2013.01); H03F 3/19 (2013.01);
(Continued)

(58) Field of Classification Search
CPC ........... H04L 27/2657; H04L 2027/003; H04L 2027/0065; H04L 27/2332; H04L 27/0014;
(Continued)

(56) References Cited

U.S. PATENT DOCUMENTS 4,271,525 A * 6/1981 Watanabe ................. H04L 1/02
375/232
5,574,755 A * 11/1996 Persico .................. H03C 1/545
332/103
(Continued)

FOREIGN PATENT DOCUMENTS

EP 1 677 414 A1 5/2006
JP 2009-171469 A 7/2009

OTHER PUBLICATIONS

Wu, Jen-Chu et al., "A 60-GHz Single-ended-to-differential Vector Sum Phase Shifter in CMOS for Phased-Array Receiver", published 2011.*
(Continued)

Primary Examiner — James M Perez
(74) Attorney, Agent, or Firm — Arent Fox LLP

(57) ABSTRACT

A wireless communication device includes a delay circuit to generate four or more delay signals, an amplifier circuit amplifying the four or more delay signals to generate four or more amplified delay signals, and a combiner circuit combining at least two amplified delay signals to generate an output signal, a second phase of a second amplified delay signal is between a first phase of a first amplified delay signal and a third phase of a third amplified delay signal, gains of the amplifier circuit for the four or more delay signals are controlled such that the output signal is generated by combining the first amplified delay signal and the third amplified delay signal, and a phase of the output signal is between the first phase of the first amplified delay signal and the third phase of the third amplified delay signal.

20 Claims, 15 Drawing Sheets

| PHASE OF OUTPUT SIGNAL (°) | GAIN OF AMPLIFIER 123 (dB) | GAIN OF AMPLIFIER 124 (dB) | GAIN OF AMPLIFIER 125 (dB) | GAIN OF AMPLIFIER 126 (dB) | GAIN OF AMPLIFIER 127 (dB) | GAIN OF AMPLIFIER 128 (dB) |
|---|---|---|---|---|---|---|
| 0 | OFF | 17.25 | OFF | OFF | 12 | 17.25 |
| 5 | OFF | 17.25 | OFF | OFF | 12 | 16.5 |
| 10 | OFF | 12 | OFF | OFF | OFF | 15 |
| 15 | OFF | 12.75 | OFF | OFF | OFF | 15 |
| 20 | OFF | 13.5 | OFF | OFF | OFF | 15 |
| 25 | OFF | 14.25 | OFF | OFF | OFF | 15 |
| 30 | OFF | 15 | OFF | OFF | OFF | 15 |
| 35 | OFF | 15.75 | OFF | OFF | OFF | 15 |
| 40 | OFF | 16.5 | OFF | OFF | OFF | 15 |
| 45 | OFF | 17.25 | OFF | OFF | OFF | 15 |
| 50 | OFF | 18 | OFF | OFF | OFF | 15 |
| 55 | OFF | 16.5 | 12 | OFF | OFF | 17.25 |
| 60 | OFF | 17.25 | 12 | OFF | OFF | 17.25 |

(51) Int. Cl.
*H04L 25/49* (2006.01)
*H04B 7/06* (2006.01)
*H01Q 3/26* (2006.01)
*H03F 1/02* (2006.01)
*H03F 3/19* (2006.01)
*H03F 3/21* (2006.01)
*H03F 3/24* (2006.01)
*H03F 3/72* (2006.01)
*H03G 3/30* (2006.01)
*H03H 11/34* (2006.01)
*H04B 1/40* (2015.01)
*H04L 5/00* (2006.01)

(52) U.S. Cl.
CPC ............ *H03F 3/211* (2013.01); *H03F 3/245* (2013.01); *H03F 3/72* (2013.01); *H03G 3/3042* (2013.01); *H03G 3/3084* (2013.01); *H03H 11/34* (2013.01); *H04B 1/40* (2013.01); *H04L 5/006* (2013.01); *H03F 2200/451* (2013.01); *H03F 2203/21112* (2013.01)

(58) Field of Classification Search
CPC  H04L 27/3809; H03G 3/3052; H03G 3/3068; H03G 3/001; H03G 3/3078
USPC .................................. 375/316–352, 295–297
See application file for complete search history.

(56) References Cited

U.S. PATENT DOCUMENTS

| | | | | |
|---|---|---|---|---|
| 5,901,349 A * | 5/1999 | Guegnaud | ............... | H03D 7/18 455/285 |
| 6,275,540 B1 * | 8/2001 | Barrett, Jr. | ........... | H04B 1/0003 341/143 |
| 6,417,712 B1 * | 7/2002 | Beards | ..................... | H03C 3/40 327/231 |
| 6,693,980 B1 * | 2/2004 | Linder | .................. | H03D 7/165 329/304 |
| 6,768,391 B1 * | 7/2004 | Dent | ........................ | H03C 3/40 327/359 |
| 7,272,200 B2 * | 9/2007 | Nishimura | ............. | H03K 5/082 375/345 |
| 7,286,811 B2 * | 10/2007 | Kral | ....................... | H03D 3/008 375/316 |
| 7,321,640 B2 * | 1/2008 | Milne | .................... | H04L 27/364 375/302 |
| 7,324,561 B1 * | 1/2008 | Miller | .................... | H03K 5/08 331/182 |
| 7,496,152 B2 * | 2/2009 | Nagatani | .................. | H03F 1/32 375/219 |
| 7,653,149 B2 * | 1/2010 | Strich | ................... | H04W 16/06 370/206 |
| 7,656,984 B2 * | 2/2010 | Kim | ..................... | H03L 7/0812 375/373 |
| 7,680,210 B2 * | 3/2010 | Bode | .................. | H04L 27/0008 375/297 |
| 7,783,269 B2 * | 8/2010 | Vinayak | ................ | H03F 1/0222 330/136 |
| 7,787,520 B2 * | 8/2010 | Kent | .................. | H04L 25/0204 342/174 |
| 7,894,507 B2 * | 2/2011 | Kent | .................. | H04L 25/0204 375/144 |
| 8,098,776 B2 * | 1/2012 | Kent | .................... | H04B 7/0697 375/141 |
| 8,111,789 B2 * | 2/2012 | Kent | .................. | H04L 25/0204 342/377 |
| 8,140,039 B2 * | 3/2012 | Luong | .................... | H03B 19/00 327/105 |
| 8,401,103 B2 * | 3/2013 | Iwamura | ............... | H04B 1/7093 375/146 |
| 8,457,192 B2 * | 6/2013 | Malmqvist | ............ | H03F 3/217 330/10 |
| 8,538,366 B2 * | 9/2013 | Rafi | ........................ | H03D 7/00 375/345 |
| 8,675,714 B2 * | 3/2014 | Cheung | ............ | H04L 25/03885 375/214 |
| 8,774,315 B2 * | 7/2014 | Cahn | ..................... | H04B 1/707 375/274 |
| 8,798,216 B2 * | 8/2014 | Pullela | .................. | H03D 7/165 375/318 |
| 8,831,136 B2 * | 9/2014 | Ishikawa | ................ | H04B 15/00 375/295 |
| 8,908,798 B2 * | 12/2014 | Wilson | ...................... | H03F 3/38 375/295 |
| 8,923,438 B1 * | 12/2014 | Taft | ....................... | H04L 25/497 375/296 |
| 8,965,454 B2 * | 2/2015 | Vella-Coleiro | ......... | H01P 1/213 330/149 |
| 8,995,568 B1 * | 3/2015 | Wu | .......................... | H04K 1/02 375/260 |
| 9,088,471 B1 * | 7/2015 | Kim | ...................... | H04L 27/362 |
| 9,191,127 B2 * | 11/2015 | Koli | ...................... | H03H 19/008 |
| 9,325,553 B2 * | 4/2016 | Kaukovuori | ......... | H04B 1/0057 |
| 2001/0002207 A1 * | 5/2001 | Miyamoto | ............ | H03F 1/3223 375/346 |
| 2001/0040914 A1 * | 11/2001 | Kaewell | ................... | H04B 1/62 375/147 |
| 2002/0018534 A1 * | 2/2002 | Sevenhans | ............. | H03C 1/545 375/147 |
| 2002/0126648 A1 * | 9/2002 | Kuchi | ............... | H04L 25/03006 370/347 |
| 2003/0142754 A1 * | 7/2003 | Jung | ................... | H04L 27/2614 375/260 |
| 2003/0202460 A1 * | 10/2003 | Jung | ................... | H04L 27/2621 370/208 |
| 2003/0214355 A1 * | 11/2003 | Luz | ........................... | H03F 3/24 330/124 R |
| 2004/0116083 A1 * | 6/2004 | Suzuki | .................. | H03F 1/3258 455/126 |
| 2005/0143028 A1 * | 6/2005 | Zheng | .................... | H03D 3/008 455/127.1 |
| 2005/0239430 A1 * | 10/2005 | Shah | ........................ | H03D 7/14 455/326 |
| 2006/0126702 A1 * | 6/2006 | Burdett | .................... | H04B 1/30 375/136 |
| 2006/0215784 A1 * | 9/2006 | Nam | ..................... | H04B 7/0689 375/299 |
| 2006/0293017 A1 * | 12/2006 | Kim | ..................... | H03D 7/1433 455/323 |
| 2007/0042743 A1 * | 2/2007 | Ali | ......................... | H03D 7/165 455/313 |
| 2007/0042744 A1 * | 2/2007 | Ali | ......................... | H03D 3/009 455/323 |
| 2007/0047964 A1 * | 3/2007 | Ooi | ........................ | H04B 10/66 398/147 |
| 2007/0058753 A1 * | 3/2007 | Saavedra | ................. | H03D 3/26 375/329 |
| 2007/0065157 A1 * | 3/2007 | Katagiri | ................ | H04L 27/223 398/155 |
| 2007/0065161 A1 * | 3/2007 | Miura | .................. | G02F 1/0123 398/186 |
| 2008/0079634 A1 * | 4/2008 | Nakamura | ................ | G01S 3/46 342/368 |
| 2008/0130802 A1 * | 6/2008 | Conroy | ............ | H04B 1/70754 375/346 |
| 2008/0284487 A1 * | 11/2008 | Pullela | ................ | H03D 7/1441 327/355 |
| 2009/0052577 A1 * | 2/2009 | Wang | ...................... | H04L 1/009 375/299 |
| 2009/0143031 A1 * | 6/2009 | Shah | ........................ | H03D 7/14 455/114.1 |
| 2010/0128820 A1 * | 5/2010 | Ko | ...................... | H04L 27/2273 375/330 |
| 2010/0239046 A1 * | 9/2010 | Chun | ...................... | H04L 1/0003 375/295 |
| 2011/0051790 A1 * | 3/2011 | Honda | .................... | H04B 1/0475 375/224 |

(56) References Cited

U.S. PATENT DOCUMENTS

| | | | | |
|---|---|---|---|---|
| 2011/0103508 A1* | 5/2011 | Mu | ......................... | H03F 3/195 375/295 |
| 2012/0063555 A1* | 3/2012 | Pullela | ................. | H04B 1/1638 375/350 |
| 2012/0213532 A1* | 8/2012 | Hironishi | ........... | H04B 10/6165 398/208 |
| 2012/0308227 A1* | 12/2012 | Komaki | ........... | H04B 10/25073 398/25 |
| 2014/0232589 A1* | 8/2014 | Trotta | .................. | H03F 1/0205 342/175 |
| 2014/0321576 A1* | 10/2014 | Mirzaei | ................ | H04B 7/0682 375/297 |
| 2015/0030105 A1* | 1/2015 | Vora | ........................ | H03D 7/165 375/297 |
| 2015/0103952 A1* | 4/2015 | Wang | .................... | H04L 27/368 375/297 |
| 2015/0117567 A1* | 4/2015 | Winoto | ................... | H03F 3/195 375/297 |
| 2015/0222464 A1* | 8/2015 | Liu | .......................... | H04L 27/22 375/327 |
| 2015/0236736 A1* | 8/2015 | Murphy | ................. | H04B 15/06 455/305 |
| 2015/0280665 A1* | 10/2015 | Ahmed | .................... | G06G 7/10 375/349 |
| 2015/0349749 A1* | 12/2015 | D'Souza | ............ | H03H 11/1291 375/297 |
| 2016/0013820 A1* | 1/2016 | Yamanouchi | ........ | H04B 1/0475 375/297 |
| 2016/0056848 A1* | 2/2016 | Kiss | ........................ | H03C 1/52 375/297 |
| 2016/0105299 A1* | 4/2016 | Chee | ................... | H04L 27/0002 375/297 |
| 2016/0164553 A1* | 6/2016 | Kurihara | ................ | H03F 3/245 375/297 |

OTHER PUBLICATIONS

Kim, Younghwan et al., "A 220-320-GHz Vector-Sum Phase Shifter Using Single Gilbert-Cell Structure With Lossy Output Matching", IEEE Transactions on Microwave Theory and Techniques, vol. 63, No. 1, pp. 256-265, Jan. 2015.

European Search Report of related European Patent Application No. 16159109.4 dated Jul. 29, 2016.

\* cited by examiner

FIG. 3

| PHASE OF OUTPUT SIGNAL (°) | GAIN OF AMPLIFIER 123 (dB) | GAIN OF AMPLIFIER 124 (dB) | GAIN OF AMPLIFIER 125 (dB) | GAIN OF AMPLIFIER 126 (dB) | GAIN OF AMPLIFIER 127 (dB) | GAIN OF AMPLIFIER 128 (dB) |
|---|---|---|---|---|---|---|
| 0 | OFF | 17.25 | OFF | OFF | 12 | 17.25 |
| 5 | OFF | 17.25 | OFF | OFF | 12 | 16.5 |
| 10 | OFF | 12 | OFF | OFF | OFF | 15 |
| 15 | OFF | 12.75 | OFF | OFF | OFF | 15 |
| 20 | OFF | 13.5 | OFF | OFF | OFF | 15 |
| 25 | OFF | 14.25 | OFF | OFF | OFF | 15 |
| 30 | OFF | 15 | OFF | OFF | OFF | 15 |
| 35 | OFF | 15.75 | OFF | OFF | OFF | 15 |
| 40 | OFF | 16.5 | OFF | OFF | OFF | 15 |
| 45 | OFF | 17.25 | OFF | OFF | OFF | 15 |
| 50 | OFF | 18 | 12 | OFF | OFF | 15 |
| 55 | OFF | 16.5 | 12 | OFF | OFF | 17.25 |
| 60 | OFF | 17.25 | OFF | OFF | OFF | 17.25 |

FIG. 4

| CERTAIN PHASE RANGE IN WHICH PHASE OF OUTPUT SIGNAL EXISTS | PHASE OF ONE OF SIGNALS | PHASE OF OTHER SIGNAL |
|---|---|---|
| 0°~60° | 330° | 90° |
| 60°~120° | 30° | 150° |
| 120°~180° | 90° | 210° |
| 180°~240° | 150° | 270° |
| 240°~300° | 210° | 330° |
| 300°~360° | 270° | 30° |

FIG. 10

| CERTAIN PHASE RANGE IN WHICH PHASE OF OUTPUT SIGNAL EXISTS | PHASE OF ONE OF SIGNALS | PHASE OF THE OTHER SIGNAL |
|---|---|---|
| 22.5°~67.5° | 360° | 90° |
| 67.5°~112.5° | 45° | 135° |
| 112.5°~157.5° | 90° | 180° |
| 157.5°~202.5° | 135° | 225° |
| 202.5°~247.5° | 180° | 270° |
| 247.5°~292.5° | 225° | 315° |
| 292.5°~337.5° | 270° | 360° |
| 337.5°~22.5° | 315° | 45° |

WIRELESS COMMUNICATION DEVICE, CONTROL METHOD OF WIRELESS COMMUNICATION DEVICE AND PHASE SHIFTER

CROSS-REFERENCE TO RELATED APPLICATION

This application is based upon and claims the benefit of priority of the prior Japanese Patent Application No. 2015-047654, filed on Mar. 10, 2015, the entire contents of which are incorporated herein by reference.

FIELD

The embodiments discussed herein are related to a wireless communication device, a control method of the wireless communication device and a phase shifter.

BACKGROUND

Recently, with an increase in a communication amount of wireless communication, data communication using a high-frequency band of 30 GHz or more has been performed. In such a situation, as a communication scheme used to suppress attenuation of radio waves, an array synthesis scheme has attracted attention. The array synthesis scheme is a technology that suppresses attenuation of radio waves so that the directivity of each antenna is enhanced by outputting output signals each having a certain phase through a plurality of antennas so as to combine the output signals.

In a wireless communication device that employs the array synthesis scheme, a vector synthesis type phase shifter may be used in order to obtain a certain phase. The vector synthesis type phase shifter includes two amplifiers in each of which the gain is variable and that respectively amplify two signals that have been obtained by dividing an input signal, and the phase of which are different from each other by 90°, and generates an output signal having a certain phase by combining the outputs from the two amplifiers. The phase of the output signal is changed so that the gains of the two amplifiers provided in the vector synthesis type phase shifter are controlled.

As a technology that obtains a certain phase using the vector synthesis type phase shifter, a related art is known in which four amplifiers the phases of which are different from each other by 90° are provided in the vector synthesis type phase shifter, and outputs from certain two amplifiers of the four amplifiers are combined to generate an output signal. As technical literatures of the related art, there is a Japanese Laid-open Patent Publication No. 2009-171469.

SUMMARY

According to an aspect of the invention, a wireless communication device includes a delay circuit configured to receive an input signal to generate four or more delay signals, the four or more delay signals having different phases, an amplifier circuit configured to amplify the four or more delay signals to generate four or more amplified delay signals, and a combiner circuit configured to combine at least two amplified delay signals included in the four or more amplified delay signals to generate an output signal, wherein the four or more amplified delay signals include a first amplified delay signal, a second amplified delay signal and a third amplified delay signal, a second phase of the second amplified delay signal is between a first phase of the first amplified delay signal and a third phase of the third amplified delay signal, gains of the amplifier circuit for the four or more delay signals are controlled such that the output signal is generated by combining the first amplified delay signal and the third amplified delay signal, and a phase of the output signal is between the first phase of the first amplified delay signal and the third phase of the third amplified delay signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 is a diagram illustrating an example of a storage unit according to the first embodiment;

FIG. 4 is a diagram illustrating a relationship between a certain phase range in the first embodiment and phases of two signals that sandwich the certain phase range;

FIG. 10 is a diagram illustrating a relationship between a certain phase range in the second embodiment and phases of two signals that sandwich the certain phase range;

DESCRIPTION OF EMBODIMENTS

In the related art, there is a problem that the control width of the gains respectively set to the plurality of amplifiers provided in the vector synthesis type phase shifter is increased.

That is, in the related art, an output signal is generated by combining outputs of certain two amplifiers from among the four amplifiers provided in the vector synthesis type phase shifter, and the phase of the output signal exists in a phase range that is sandwiched by the phases of two signals respectively amplified by the two amplifiers. Therefore, in the related art, in order to generate an output signal corresponding to the vicinity of the end areas of the above-described phase range, the gain of one of the two amplifiers is significantly increased for the gain of the other amplifier, and the outputs of the two amplifiers are combined. That is, in the related art, a difference between the gains respectively set to the two amplifiers is increased, and the two signals are respectively amplified by the two gains between which the difference has been increased. As a result, in the related art, the control width of the gains respectively set to the plurality of amplifiers provided in the vector synthesis type phase shifter may be increased undesirably.

The technology discussed herein has been made in view of the above problem, and an object of the technology is to provide a wireless communication device that suppresses the control width of gains respectively set to a plurality of amplifiers provided in a vector synthesis type phase shifter and a control method of the wireless communication device.

In a wireless communication device according to an embodiment, the control width of gains respectively set to a plurality of amplifiers provided in a vector synthesis type phase shifter is suppressed.

Embodiments of a wireless communication device of the technology discussed herein and a control method of the wireless communication device of the technology discussed herein are described below in detail with reference to drawings. The wireless communication device of the technology discussed herein is not limited to the embodiments.

Figure 13:
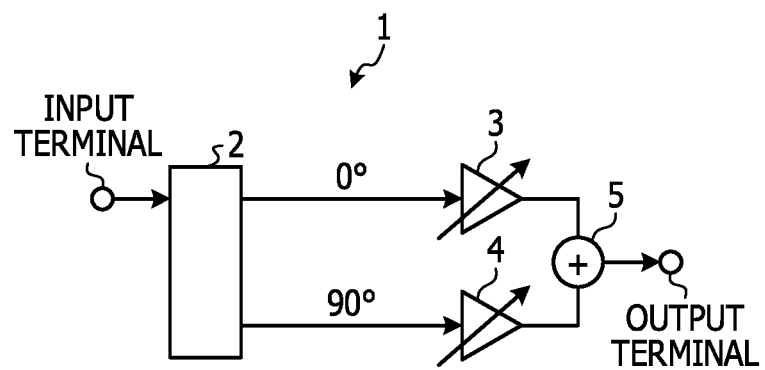
FIG. 13 is a diagram illustrating a configuration example of a vector synthesis type phase shifter applied to a wireless communication device according to a premise technology.

First, a technology that is a premise of the wireless communication device discussed herein is described with reference to FIGS. 13, 14 and 15. FIG. 13 is a diagram illustrating a configuration example of a vector synthesis type phase shifter applied to a wireless communication device according to a premise technology. As illustrated in FIG. 13, a vector synthesis type phase shifter 1 according to the premise technology includes a 90° Hybrid 2, a Variable Gain Amplifier (VGA) 3, a VGA 4, and a combiner 5.

The 90° Hybrid 2 divides an input signal from an input terminal, into two signals the phases of which are different from each other by 90°. The 90° Hybrid 2 outputs a signal the phase of which is 0° (hereinafter referred to as "0° signal"), to the VGA 3, and outputs a signal the phase of which is 90° (hereinafter referred to as "90° signal"), to the VGA 4, from among the two signals that have been obtained through the dividing.

The VGA 3 is a variable gain amplifier. The VGA 3 receives a VGA control signal used to set the gain as a set gain, from the gain control unit that is not illustrated. In addition, the VGA 3 sets the gain of the VGA 3 as the set gain that has been specified by the VGA control signal. The VGA 3 receives an input of the 0° signal from the 90° Hybrid 2. In addition, the VGA 3 amplifies the 0° signal by the set gain that has been specified by the VGA control signal, and outputs the amplified 0° signal to the combiner 5.

The VGA 4 is a variable gain amplifier. The VGA 4 receives a VGA control signal used to set the gain as a set gain, from a gain control unit that is not illustrated. In addition, the VGA 4 sets the gain of the VGA 4 as the set gain that has been specified by the VGA control signal. The VGA 4 receives an input of the 90° signal from the 90° Hybrid 2. In addition, the VGA 4 amplifies the 90° signal by the set gain that has been specified by the VGA control signal, and outputs the amplified 90° signal to the combiner 5.

The combiner 5 receives an input of the 0° signal that has been amplified by the VGA 3, from the VGA 3. The combiner 5 receives an input of the 90° signal that has been amplified by the VGA 4, from the VGA 4. The combiner 5 combines the 0° signal from the VGA 3 and the 90° signal from the VGA 4 to generate an output signal that is a vector sum of the 0° signal and the 90° signal, and outputs the generated output signal to an output terminal. The phase of the output signal output from the combiner 5 is changed within the phase range of 0° to 90° so that each of the gains of the VGAs 3 and 4 is controlled by the corresponding VGA control signal.

Figure 14:
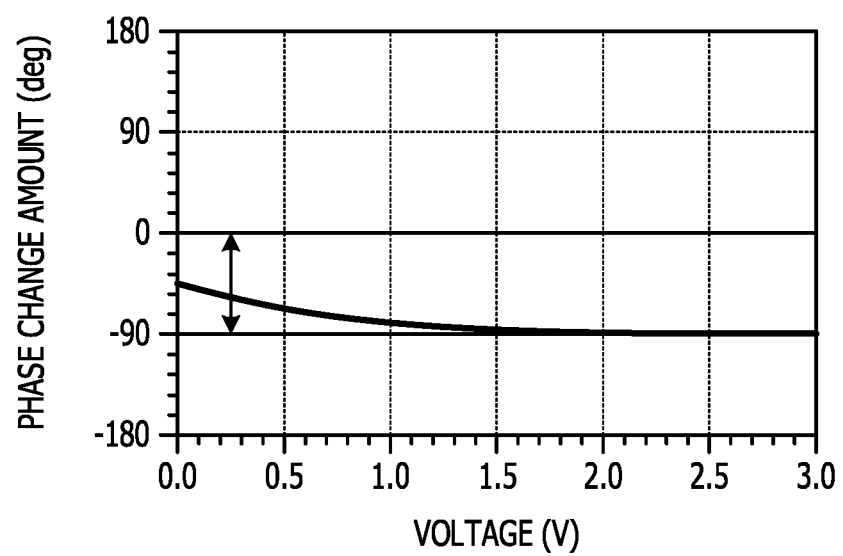
FIG. 14 is a diagram illustrating a change in a phase of an output signal in the wireless communication device according to the premise technology.
Figure 15:
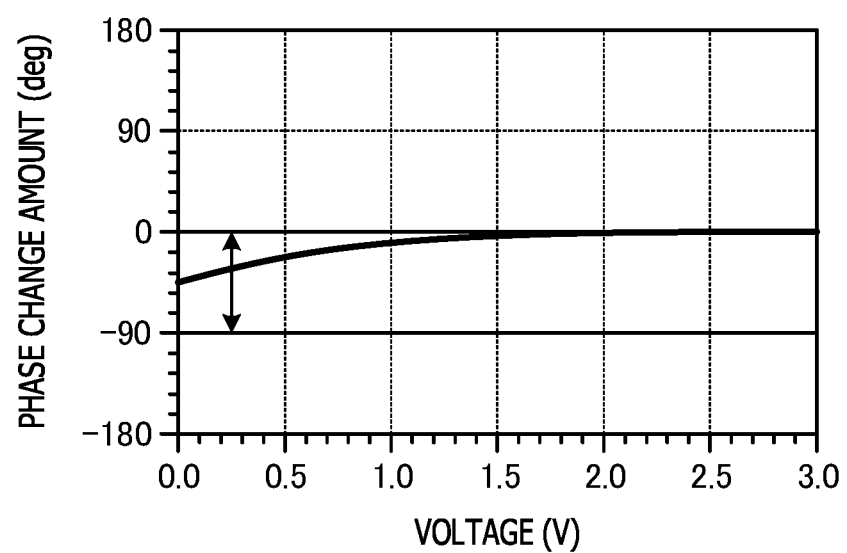
FIG. 15 is a diagram illustrating a change in a phase of an output signal in the wireless communication device according to the premise technology.

FIGS. 14 and 15 are diagrams illustrating changes in output signals in the wireless communication device according to the premise technology. Each of FIGS. 14 and 15 illustrates a change in the phase of the output signal output from the combiner 5 when the gain set to one of the VGAs 3 and 4 is fixed, and the gain set to the other VGA is changed. In FIGS. 14 and 15, the horizontal axis indicates voltage (V) used to change the gain of the VGA 3 or 4, and the vertical axis indicates a change amount (deg) of the phase of the output signal output from the combiner 5. It is assumed that the gain of the VGA 3 or 4 is changed within the range of 45 to 0 dB when the voltage is changed within the range of 0 to 3V.

As illustrated in FIGS. 14 and 15, the change amount of the phase of the output signal output from the combiner 5 is changed within the range of −90° to 0° when the gain of the VGA 3 or 4 is changed within the range of 45 to 0 dB. That is, the phase of the output signal output from the combiner 5 is changed within the phase range of 0° to 90° when the gain of the VGA 3 or 4 is changed within the range of 45 to 0 dB.

Here, the problem of the wireless communication device according to the premise technology is described below. That is, in the wireless communication device according to the premise technology, the phase of the output signal exists in a phase range of 0° to 90°, which is sandwiched by the phases of the 0° signal and the 90° signal respectively amplified by the VGAs 3 and 4. Therefore, in the premise technology, when an output signal having the phase corresponding to the vicinity of the ends of the phase range (vicinity of 0° and 90°) is generated, the gain of one of the VGAs 3 and 4 is significantly increased for the gain of the other VGA, and the outputs of the VGAs 3 and 4 are combined. For example, in the premise technology, when the output signal the phase of which is 0° or the output signal the phase of which is 90° is generated, as illustrated in FIGS. 14 and 15, the gain of the corresponding VGA is changed at maximum within the range of 45 to 0 dB. That is, in the premise technology, a difference of the gains respectively set to the VGAs 3 and 4 is increased at maximum, and the outputs of the VGAs 3 and 4 are combined, so that an output signal the phase of which is 0° or the output signal the phase of which is 90° is generated. As a result, in the premise technology, the control width of gains respectively set to a plurality of VGAs provided in the vector synthesis type phase shifter 1 is increased undesirably.

First Embodiment

Figure 1:
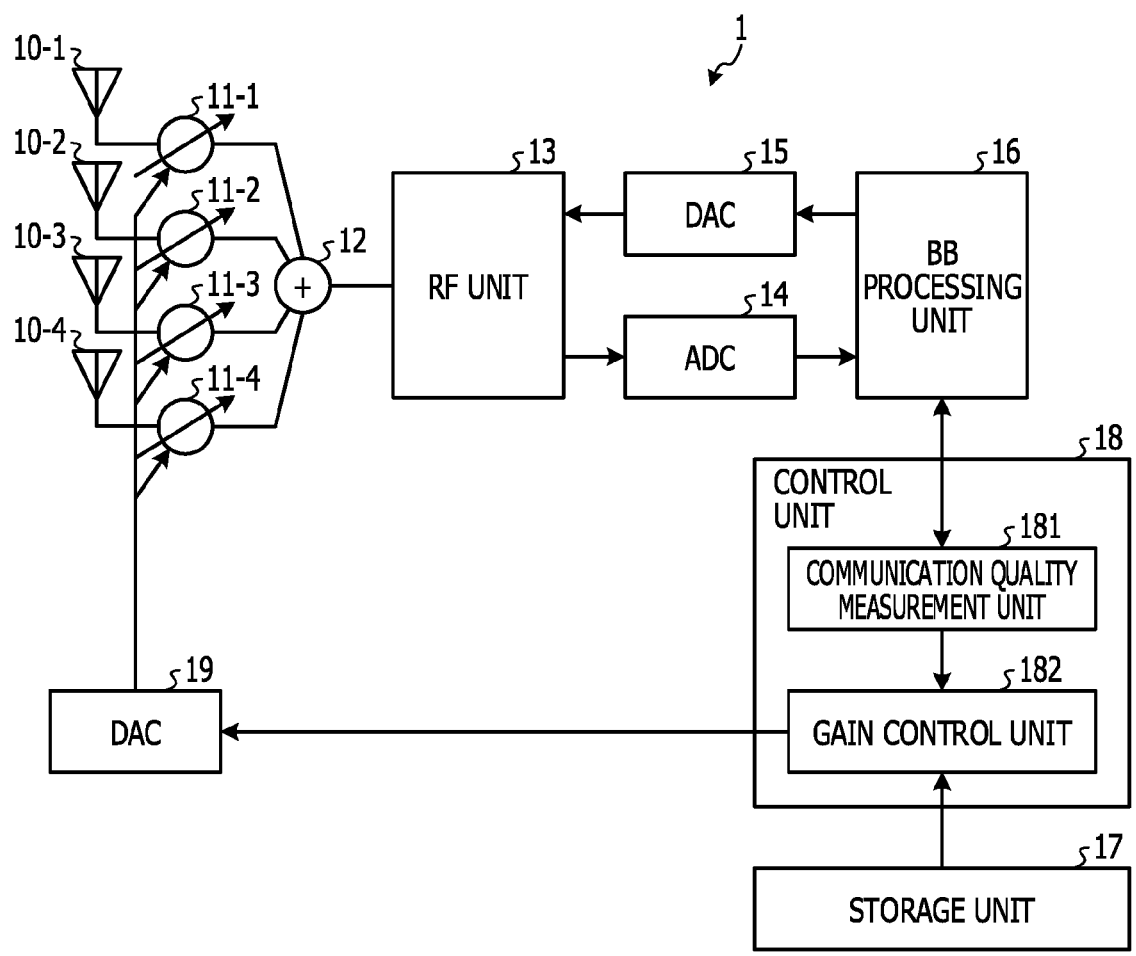
FIG. 1 is a diagram illustrating a configuration example of a wireless communication device according to a first embodiment.

FIG. 1 is a diagram illustrating a configuration example of a wireless communication device according to a first embodiment. As illustrated in FIG. 1, a wireless communication device 1 according to the embodiment includes antennas 10-1 to 10-4, phase shifters 11-1 to 11-4 combiner 12, a Radio Frequency (RF) unit 13, and an Analog-to- Digital Converter (ADC) 14. In addition, the wireless communication device 1 includes a Digital-to-Analog Converter (DAC) 15, a Base Band (BB) processing unit 16, a storage unit 17, a control unit 18, and a DAC 19.

The configurations and the functions of the antennas 10-1 to 10-4 are similar, so that, hereinafter, the antennas 10-1 to 10-4 are referred to as "antennas 10" when the antennas are not particularly distinguished. In addition, the configurations and the functions of the phase shifters 11-1 to 11-4 are similar, so that, hereinafter, the phase shifter 11-1 to 11-4 are referred to as "phase shifters 11" when the phase shifters are not particularly distinguished.

The antenna 10 receives a signal that has been transmitted from a wireless communication device on the other side, and outputs the received signal to the corresponding phase shifter 11 as an input signal. In addition, the antenna 10 receives an output signal output from the corresponding phase shifter 11, and emits the output signal to space as electromagnetic waves.

The phase shifter 11 includes four or more VGAs that respectively amplifies four or more signals each having a different phase and in each of which the gain is variable, and combines outputs from some VGAs to each of which the gain is set, from among the four or more VGAs, to generate an output signal having a certain phase. In the embodiment, the phase shifter 11 includes six VGAs and combines outputs from some VGAs to each of which the gain is set, from among the six VGAs, to generate an output signal having a certain phase. The phase shifter 11 outputs the generated output signal to the corresponding antenna 10 or the combiner 12.

Figure 2:
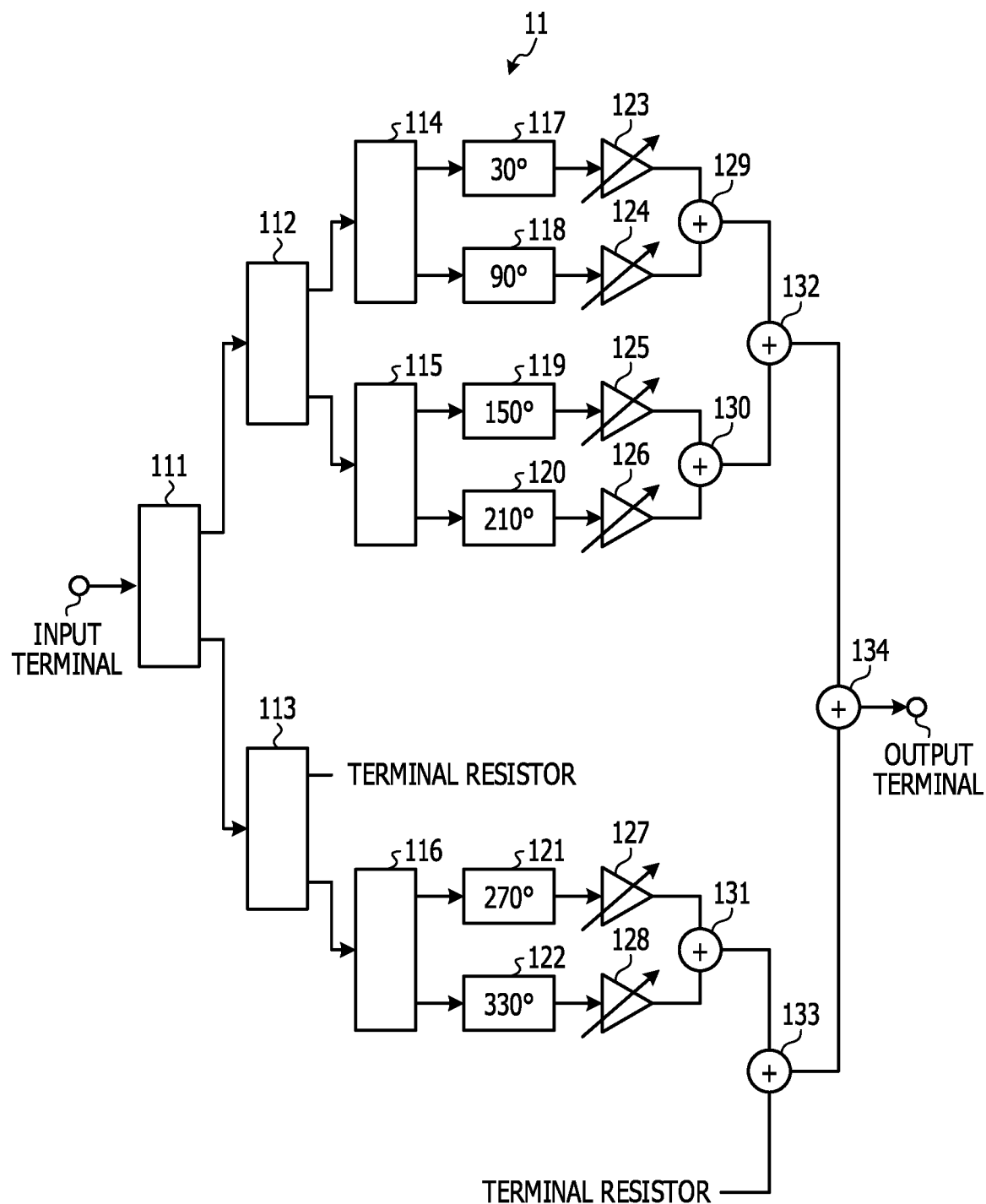
FIG. 2 is a diagram illustrating a configuration example of a phase shifter according to the first embodiment.

FIG. 2 is a diagram illustrating a configuration example of the phase shifter according to the first embodiment. As illustrated in FIG. 2, the phase shifter 11 includes distributors 111 to 116, delay units 117 to 122, VGAs 123 to 128, and combiners 129 to 134.

The distributor 111 divides an input signal from an input terminal, into two signals, outputs one of the two signals that have been obtained through the dividing, to the distributor 112, and outputs the other signal, to the distributor 113. Here, it is assumed that the input terminal may be connected to the corresponding antenna 10 or the combiner 12 selectively. The distributor 112 divides the signal from the distributor 111, into two signals, outputs one of the two signals that have been obtained through the dividing, to the distributor 114, and outputs the other signal, to the distributor 115. The distributor 113 divides the signal from the distributor 111, into two signals, and output one of the two signals that have been obtained through the dividing, to a terminal resistor, and outputs the other signal, to the distributor 116. The distributor 114 divides the signal from the distributor 112, into two signals, outputs one of the two signals that have been obtained through the dividing, to the delay unit 117, and outputs the other signal to the delay unit 118. The distributor 115 divides the signal from the distributor 112, into two signals, outputs one of the two signals that have been obtained through the dividing, to the delay unit 119, and outputs the other signal to the delay unit 120. The distributor 116 divides the signal from the distributor 113, into two signals, outputs one of the two signals that have been obtained through the dividing, to the delay unit 121, and outputs the other signal to the delay unit 122.

The delay unit 117 generates a signal the phase of which is 30° (hereinafter referred to as "30° signal") by delaying the signal from the distributor 114, and outputs the 30° signal to the VGA 123. The delay unit 118 generates a signal the phase of which is 90° (hereinafter referred to as "90° signal") by delaying the signal from the distributor 114, and outputs the 90° signal to the VGA 124. The delay unit 119 generates a signal the phase of which is 150° (hereinafter referred to as "150° signal") by delaying the signal from the distributor 115, and outputs the 150° signal to the VGA 125. The delay unit 120 generates a signal the phase of which is 210° (hereinafter referred to as "210° signal") by delaying the signal from the distributor 115, and outputs the 210° signal to the VGA 126. The delay unit 121 generates a signal the phase of which is 270° (hereinafter referred to as "270° signal") by delaying the signal from the distributor 116, and outputs the 270° signal to the VGA 127. The delay unit 122 generates a signal the phase of which is 330° (hereinafter referred to as "330° signal") by delaying the signal from the distributor 116, and outputs the 330° signal to the VGA 128. The 30° signal, the 90° signal, the 150° signal, the 210° signal, the 270° signal, and the 330° signal are examples of four or more signals each having a different phase.

The VGA 123 is a variable gain amplifier. The VGA 123 receives a VGA control signal used to set the gain as a set gain, from a gain control unit 182 of the control unit 18, which is described later. In addition, when the VGA 123 has received the VGA control signal, the VGA 123 sets the gain of the VGA 123 as the set gain that has been specified by the VGA control signal. The VGA 123 receives an input of the 30° signal from the delay unit 117. In addition, the VGA 123 amplifies the 30° signal by the set gain that has been specified by the VGA control signal, and outputs the amplified 30° signal to a combiner 129. When the set gain is not specified by the VGA control signal, the VGA 123 stops the operation of the VGA 123, and does not output the 30° signal to the combiner 129.

The VGA 124 is a variable gain amplifier. The VGA 124 receives a VGA control signal used to set the gain as a set gain, from the gain control unit 182 of the control unit 18. In addition, when the VGA 124 has received the VGA control signal, the VGA 124 sets the gain of the VGA 124 as the set gain that has been specified by the VGA control signal. The VGA 124 receives an input of the 90° signal from the delay unit 118. In addition, the VGA 124 amplifies the 90° signal by the set gain that has been specified by the VGA control signal, and outputs the amplified 90° signal to the combiner 129. When the set gain is not specified by the VGA control signal, the VGA 124 stops the operation of the VGA 124 and does not output the 90° signal to the combiner 129.

The VGA 125 is a variable gain amplifier. The VGA 125 receives a VGA control signal used to set the gain as a set gain, from the gain control unit 182 of the control unit 18. In addition, when the VGA 125 has received the VGA control signal, the VGA 125 sets the gain of the VGA 125 as the set gain that has been set by the VGA control signal. The VGA 125 receives an input of the 150° signal from the delay unit 119. In addition, the VGA 125 amplifies the 150° signal by the set gain that has been specified by the VGA control signal, and outputs the amplified 150° signal to a combiner 130. When the set gain is not specified by the VGA control signal, the VGA 125 stops the operation of the VGA 125, and does not output the 150° signal to the combiner 130.

The VGA 126 is a variable gain amplifier. The VGA 126 receives a VGA control signal used to set the gain as a set gain, from the gain control unit 182 of the control unit 18. In addition, when the VGA 126 has received the VGA control signal, the VGA 126 sets the gain of the VGA 126 as the set gain that has been specified by the VGA control signal. The VGA 126 receives an input of the 210° signal from the delay unit 120. In addition, the VGA 126 amplifies the 210° signal by the set gain that has been specified by the VGA control signal, and outputs the amplified 210° signal to the combiner 130. When the set gain is not specified by the VGA control signal, the VGA 126 stops the operation of the VGA 126, and does not output the 210° signal to the combiner 130.

The VGA 127 is a variable gain amplifier. The VGA 127 receives a VGA control signal used to set the gain as a set gain, from the gain control unit 182 of the control unit 18. In addition, when the VGA 127 has received the VGA control signal, the VGA 127 sets the gain of the VGA 127 as the set gain that has been specified by the VGA control signal. The VGA 127 receives an input of the 270° signal from the delay unit 121. In addition, the VGA 127 amplifies the 270° signal by the set gain that has been specified by the VGA control signal, and outputs the amplified 270° signal to a combiner 131. When the set gain is not specified by the VGA control signal, the VGA 127 stops the operation of the VGA 127, and does not output the 270° signal to the combiner 131.

The VGA 128 is a variable gain amplifier. The VGA 128 receives a VGA control signal used to set the gain as a set gain, from the gain control unit 182 of the control unit 18. In addition, when the VGA 128 has received the VGA control signal, the VGA 128 sets the gain of the VGA 128 as the set gain that has been specified by the VGA control signal. The VGA 128 receives an input of the 330° signal from the delay unit 122. In addition, the VGA 128 amplifies the 330° signal by the set gain that has been specified by the VGA control signal, and outputs the amplified 330° signal to the combiner 131. When the set gain is not specified by the VGA control signal, the VGA 128 stops the operation of the VGA 128, and does not output the 330° signal to the combiner 131.

The combiner 129 receives an input of the 30° signal that has been amplified by the VGA 123, from the VGA 123. The combiner 129 receives an input of the 90° signal that has been amplified by the VGA 124, from the VGA 124. When the combiner 129 receives both of the input of the 30° signal and the input of the 90° signal, the combiner 129 combines the 30° signal and the 90° signal to generate an output signal that is a vector sum of the 30° signal and the 90° signal, and outputs the generated output signal to a combiner 132. In addition, when the combiner 129 receives merely one of the input of the 30° signal that has been amplified by the VGA 123 and the input of the 90° signal that has been amplified by the VGA 124, the combiner 129 outputs the received signal to the combiner 132 as an output signal.

The combiner 130 receives an input of the 150° signal that has been amplified by the VGA 125, from the VGA 125. The combiner 130 receives an input of the 210° signal that has been amplified by the VGA 126, from the VGA 126. When the combiner 130 receives both of the input of the 150° signal and the input of the 210° signal, the combiner 130 combines the 150° signal and the 210° signal to generate an output signal that is a vector sum of the 150° signal and the 210° signal, and outputs the generated output signal to the combiner 132. In addition, when the combiner 130 receives merely one of the input of the 150° signal that has been amplified by the VGA 125 and the input of the 210° signal that has been amplified by the VGA 126, the combiner 130 outputs the received signal to the combiner 132 as an output signal.

The combiner 131 receives an input of the 270° signal that has been amplified by the VGA 127, from the VGA 127. The combiner 131 receives an input of the 330° signal that has been amplified by the VGA 128, from the VGA 128. When the combiner 131 receives both of the inputs of the 270° signal and the 330° signal, the combiner 131 combines the 270° signal and the 330° signal to generate an output signal that is a vector sum of the 270° signal and the 330° signal, and outputs the generated output signal to a combiner 133. In addition, when the combiner 131 receives merely one of the input of the 270° signal that has been amplified by the VGA 127 and the input of the 330° signal that has been amplified by the VGA 128, the combiner 131 outputs the received signal to the combiner 133 as an output signal.

The combiner 132 receives an input of the output signal from the combiner 129. The combiner 132 receives an input of the output signal from the combiner 130. The combiner 132 combines the output signal from the combiner 129 and the output signal from the combiner 130 to generate an output signal that is a vector sum of the output signals, and outputs the generated output signal to a combiner 134.

The combiner 133 receives an input of the output signal from the combiner 131. The combiner 133 combines the output signal from the combiner 131 and an output signal from a terminal resistor to generate an output signal that is a vector sum of the output signals, and outputs the generated output signal to the combiner 134. The output signal from the terminal resistor is "0", so that the combiner 133 outputs the output signal from the combiner 131 to the combiner 134 as is.

The combiner 134 receives an input of the output signal from the combiner 132. The combiner 134 receives an input of the output signal from the combiner 133. The combiner 134 combines the output signal from the combiner 132 and the output signal from the combiner 133 to generate an output signal that is a vector sum of the output signals, and outputs the generated output signal to an output terminal. Here, it is assumed that the output terminal may be connected to the corresponding antenna 10 or the combiner 12 selectively. The phase of the output signal output from the combiner 134 is changed within the phase range of 0° to 360° when gain of each of some VGAs from among the VGAs 123 to 128 is controlled by the VGA control signal.

Returning to FIG. 1, the combiner 12 receives inputs of the four output signals, from the phase shifters 11-1 to 11-4, respectively. The combiner 12 combines the four output signals, and outputs the output signal that has been obtained through the combination, to the RF unit 13 as a reception signal. In addition, the combiner 12 receives an input of a transmission signal, from the RF unit 13. The combiner 12 divides the transmission signal, into four input signals, outputs the four input signals that have been obtained through the dividing, to the phase shifters 11-1 to 11-4, respectively.

The RF unit 13 receives an input of the reception signal from the combiner 12. The RF unit 13 performs conversion from a wireless frequency to a baseband signal and orthogonal modulation for the reception signal, and outputs the obtained baseband signal to the ADC 14. In addition, the RF unit 13 receives an input of a transmission signal from the DAC 15. The RF unit 13 performs conversion from a baseband signal to a wireless frequency and orthogonal modulation for the transmission signal, and outputs the obtained transmission signal to the combiner 12.

The ADC 14 receives an input of the reception signal from the RF unit 13. The ADC 14 converts the reception signal into a digital signal. The ADC 14 outputs the reception signal that has been converted into the digital signal, to the BB processing unit 16.

The DAC 15 receives an input of a transmission signal that is a baseband signal, from the BB processing unit 16. The DAC 15 converts the transmission signal into an analog signal. The DAC 15 outputs the transmission signal that has been converted into the analog signal, to the RF unit 13.

The BB processing unit 16 generates a transmission signal that is a baseband signal, and outputs the generated transmission signal to the DAC 15. For example, the BB processing unit 16 generates a search packet used to search for a wireless communication device on the other side, a data packet, and the like, as the transmission signal. In addition, the BB processing unit 16 receives an input of the reception signal from the ADC 14, and executes certain baseband processing such as demodulation processing, for the reception signal.

The storage unit 17 associates the phase of the output signal with gains of two VGAs or three or more VGAs including the two VGAs from among the VGAs 123 to 128, and stores the phase and the gains so that the phase of the output signal exists in a certain phase range. Here, the certain phase range is a phase range that is sandwiched by two signals that are respectively amplified by the certain two VGAs from among the VGAs 123 to 128, and does not reach the two signals. FIG. 3 is a diagram illustrating an example of the storage unit according to the first embodiment.

As illustrated in FIG. 3, the storage unit 17 associates the phase of the output signal with gains of two VGAs or three VGAs including the two VGAs, and stores the phase and the gains so that the phase of the output signal exists within the phase range of 0° to 60°. Here, the phase range of 0° to 60° is a certain phase range that is sandwiched by the phases of the 90° signal and the 330° signal respectively amplified by the two VGAs 124 and 128, and does not reach the two signals. Here, "OFF" of gain indicates that the gain of a VGA is not specified. In addition, the illustration is omitted in FIG. 3, but the storage unit 17 associates the phase of the output signal with the gains of the two VGAs or the three VGAs, and stores the phase and the gains so that the phase of the output signal exists within a certain phase range other the phase range of 0° to 60°.

FIG. 4 is a diagram illustrating a relationship between a certain phase range in the first embodiment and phases of two signals, which sandwich the certain phase range. As illustrated in FIG. 4, as the certain phase range, the phase ranges of 0° to 60°, 60° to 120°, 120° to 180°, 180° to 240°, 240° to 300°, and 300° to 360° exist. From among these phase ranges, the phase range of 0° to 60° is a phase range that is sandwiched by the phases of the 90° signal and the 330° signal respectively amplified by the two VGAs 124 and 128, and does not reach the two signals, as described above. In addition, the phase range of 60° to 120° is a phase range that is sandwiched by the phases of the 30° signal and the 150° signal respectively amplified by two VGAs 123 and 125, and does not reach the two signals. In addition, the phase range of 120° to 180° is a phase range that is sandwiched by the phases of the 90° signal and the 210° signal respectively amplified by the two VGAs 124 and 126, and does not reach the two signals. In addition, the phase range of 180° to 240° is a phase range that is sandwiched by the phases of the 150° signal and the 270° signal respectively amplified by the two VGAs 125 and 127, and does not reach the two signals. In addition, the phase range of 240° to 300° is a phase range that is sandwiched by the phases of the 210° signal and the 330° signal respectively amplified by the two VGAs 126 and 128, and does not reach the two signals. In addition, the phase range of 300° to 360° is a phase range that is sandwiched by the phases of the 270° signal and the 30° signal respectively amplified by the two VGAs 127 and 123, and does not reach the two signals. The storage unit 17 associates the phase of the output signal with gains of two VGAs or three VGAs including the two VGA, and stores the phase and the gains so that the phase of the output signal exists in the corresponding phase range of the six certain phase ranges as illustrated in FIG. 4.

In addition, the storage unit 17 associates the phase of the output signal that exists in the central area of a certain phase range with gains of two VGAs and store the phase and the gains, and associates the phase of the output signal that exists in the end areas that sandwich the central area of the certain phase range with gains of three VGAs and stores the phase and the gains. In the example of FIG. 3, the storage unit 17 associates the phase of the output signal that exists in 10° to 50° that is the central area of the phase range of 0° to 60° with the gains of the two VGAs 124 and 128, and stores the phase and the gains. In addition, in the example of FIG. 3, the storage unit 17 associates the phase of the output signal that exists in the end areas of 0° to 5° and 55° to 60° that sandwich the central area of the phase range of 0° to 60° with the gains of the three VGAs 124, 128, and 127 or the three VGAs 124, 128, and 125, and stores the phase and the gains. Here, the phase of a boundary between the central area and each of the end areas is defined in advance with reference to a previously-defined reference. For example, the phase of the boundary between the central area and each of the end areas is defined in advance so that deviation of the amplitude of the output signal and deviation of the phase of the output signal become minimum in a frequency band used for transmission and reception of the output signal.

In addition, the gains of the two VGAs or the three or more VGAs stored in the storage unit 17 are defined in advance so that the amplitude of the output signal generated by the phase shifter 11 is fixed.

The control unit 18 includes a communication quality measurement unit 181 and the gain control unit 182.

The communication quality measurement unit 181 switches the phase of an output signal, which is used for transmission and reception of the output signal (hereinafter referred to as "transmission and reception phase") randomly, and measures a communication quality for each of a plurality of transmission and reception phases, which is obtained through the switching. For example, after the communication quality measurement unit 181 switches the transmission and reception phase, the communication quality measurement unit 181 notifies the gain control unit 182 of the transmission and reception phase obtained by the switching. When the set gain that is the gain for the transmission and reception phase is set to some amplifiers in the phase shifter 11 by the gain control unit 182, the communication quality measurement unit 181 causes the BB processing unit 16 to generate a search packet used to search for a wireless communication device on the other side. When the search packet is transmitted to the wireless communication device on the other side, and channel information is fed back from the wireless communication device on the other side, the communication quality measurement unit 181 measures a communication quality using the channel information. As the communication quality, for example, a Signal-to-Interference and Noise Ratio (SINR) or the like is calculated. The communication quality measurement unit 181 associates the measured communication quality with the transmission and reception phase and stores the measured communication quality with the transmission and reception phase in an internal memory. The communication quality measurement unit 181 measures the communication quality for each of the plurality of transmission and reception phases by repeating a series of processing from the switching of the transmission and reception phase to the storage of the communication quality in the internal memory.

The gain control unit 182 obtains a set gain that is a gain corresponding to the transmission and reception phase, from the storage unit 17, and sets the gains of the two VGAs or the three or more VGAs in the phase shifter 11 as the set gains. For example, the gain control unit 182 obtains the set gain corresponding to the transmission and reception phase notified from the communication quality measurement unit 181, from the storage unit 17, and generates a VGA control signal used to notify each of the two VGAs or the three or more VGAs in the phase shifter 11 of the obtained set gain. In addition, the gain control unit 182 outputs the generated VGA control signals to the DAC 19.

In addition, the gain control unit 182 obtains a gain corresponding to a transmission and reception phase having the most excellent communication quality that has been measured by the communication quality measurement unit 181, from the storage unit 17, as the set gain, and sets the gains of the two VGAs or the three or more VGAs in the phase shifter 11, as the set gain. For example, the gain control unit 182 determines the transmission and reception phase having the most excellent communication quality as an optimal phase, with reference to the internal memory of the communication quality measurement unit 181, and obtains a gain corresponding to the optimal phase, from the storage unit 17, as the set gain. In addition, the gain control unit 182 generates a VGA control signal used to notify each of the two VGAs or the three or more VGAs in the phase shifter 11 of the obtained set gain. In the embodiment, there exists that the four phase shifters 11 (phase shifters 11-1 to 11-4), so that the gain control unit 182 generates four VGA control signals. In addition, the gain control unit 182 outputs the generated VGA control signals to the DAC 19.

The DAC 19 receives inputs of the VGA control signals from the gain control unit 182. The DAC 19 converts the VGA control signals into analog signals, and outputs the VGA control signals that have been converted into the analog signals, to the respective two VGAs or the three or more VGAs in the phase shifter 11.

The above-described storage unit 17 is achieved by a storage device such as a memory, a hard disk, or the like. In addition, the control unit 18 is achieved by a Central Processing Unit (CPU) and a program analyzed and executed by the CPU. Alternatively, the control unit 18 may be achieved by using a Field Programmable Gate Array (FPGA).

Figure 5:
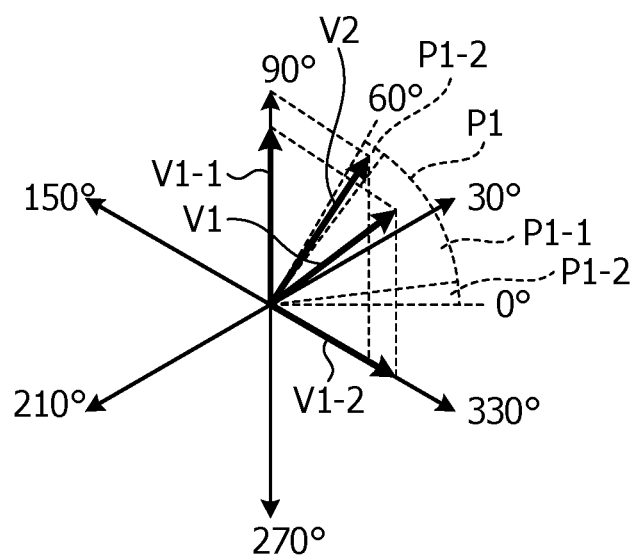
FIG. 5 is a diagram illustrating an example of processing by a gain control unit according to the first embodiment.

An example of processing by the gain control unit 182 is described below with reference to FIG. 5. FIG. 5 is a diagram illustrating the example of the processing by the gain control unit according to the first embodiment. In FIG. 5, the arrow corresponding to 30° indicates a vector of the 30° signal amplified by the VGA 123. In addition, the arrow corresponding to 90° indicates a vector of 90° signal amplified by the VGA 124. In addition, the arrow corresponding to 150° indicates a vector of the 150° signal amplified by the VGA 125. In addition, the arrow corresponding to 210° indicates a vector of the 210° signal amplified by the VGA 126. In addition, the arrow corresponding to 270° indicates a vector of the 270° signal amplified by the VGA 127. In addition, the arrow corresponding to 330° indicates a vector of the 330° signal amplified by the VGA 128.

In addition, in FIG. 5, as an example of the certain phase range, a phase range P1 of 0° to 60° is illustrated that is sandwiched by the phases of the 90° signal and the 330° signal respectively amplified by the VGAs 124 and 128, from among the VGAs 123 to 128, and does not reach the two signals. In addition, in FIG. 5, a central area P1-1 of the phase range P1 and both end areas P1-2 that sandwich the central area P1-1 of the phase range P1 are illustrated.

The gain control unit 182 obtains a set gain that is a gain corresponding to the transmission and reception phase notified from the communication quality measurement unit 181, from the storage unit 17, and sets the gains of the two VGAs or the three or more VGAs in the phase shifter 11, as the set gains. For example, when the notified transmission and reception phase exists in the central area P1-1 of the phase range P1, the gain control unit 182 executes the following. That is, the gain control unit 182 obtains the set gains of the VGAs 124 and 128 corresponding to the notified transmission and reception phase, from the storage unit 17, and set the gains of the VGAs 124 and 128 in the phase shifter 11, as the set gains. As a result, as illustrated in FIG. 5, an output V1-1 of the VGA 124 in which the gain has been set as the set gain and an output V1-2 of the VGA 128 in which the gain has been set as the set gain are combined to generate an output signal V1 that exists in the central area P1-1 of the phase range P1.

In addition, for example, when the notified transmission and reception phase exists in the end areas P1-2 of the phase range P1, the gain control unit 182 executes the following processing. That is, the gain control unit 182 obtains the set gains of three VGAs including the VGAs 124 and 128 corresponding to the notified transmission and reception phase, from the storage unit 17, and sets the gains of the three VGAs in the phase shifter 11, as the set gains. As a result, as illustrated in FIG. 5, outputs of the three VGAs in each of which the gain is set to the set gain are combined to generate an output signal V2 that exists in the end areas P1-2 of the phase range P1.

As described above, the wireless communication device 1 according to the embodiment sets the gains of the two VGAs or the three VGAs in the phase shifter 11 as the set gains so that the phase of the output signal V1 or the output signal V2 exists in the phase range P1. Here, the phase range P1 is a phase range of 0° to 60°, which is sandwiched by the phases of the 90° signal and the 330° signal respectively amplified by the VGAs 124 and 128, from among the VGAs 123 to 128, and does not reach the two signals. Therefore, the output signal V1 or the output signal V2 that exists in the phase range of 0° to 60° is generated so that the gain of one of the VGAs is not significantly increased for the gain of the other VGA from among the VGAs 124 and 128 that are respectively amplify the 90° signal and the 330° signal. As a result, in the wireless communication device 1 according to the embodiment, the control width of the gains respectively set to the plurality of VGAs provided in the vector synthesis type phase shifter is suppressed.

In addition, when the phase of the output signal exists in the end areas P1-2 of the phase range P1, the wireless communication device 1 according to the embodiment sets the gains of the three VGAs in the phase shifter 11 as the set gains. Therefore, in the wireless communication device 1 according to the embodiment, a gain difference between the VGAs is further suppressed as compared with the method in which the gains of the VGAs 124 and 128 that respectively amplify the 90° signal and the 330° signal are set as the set gains. As a result, the control width of the gains respectively set to the plurality of VGAs provided in the vector synthesis type phase shifter is allowed to be further suppressed.

A flow of processing of the wireless communication device 1 according to the embodiment is described below.

Figure 6:
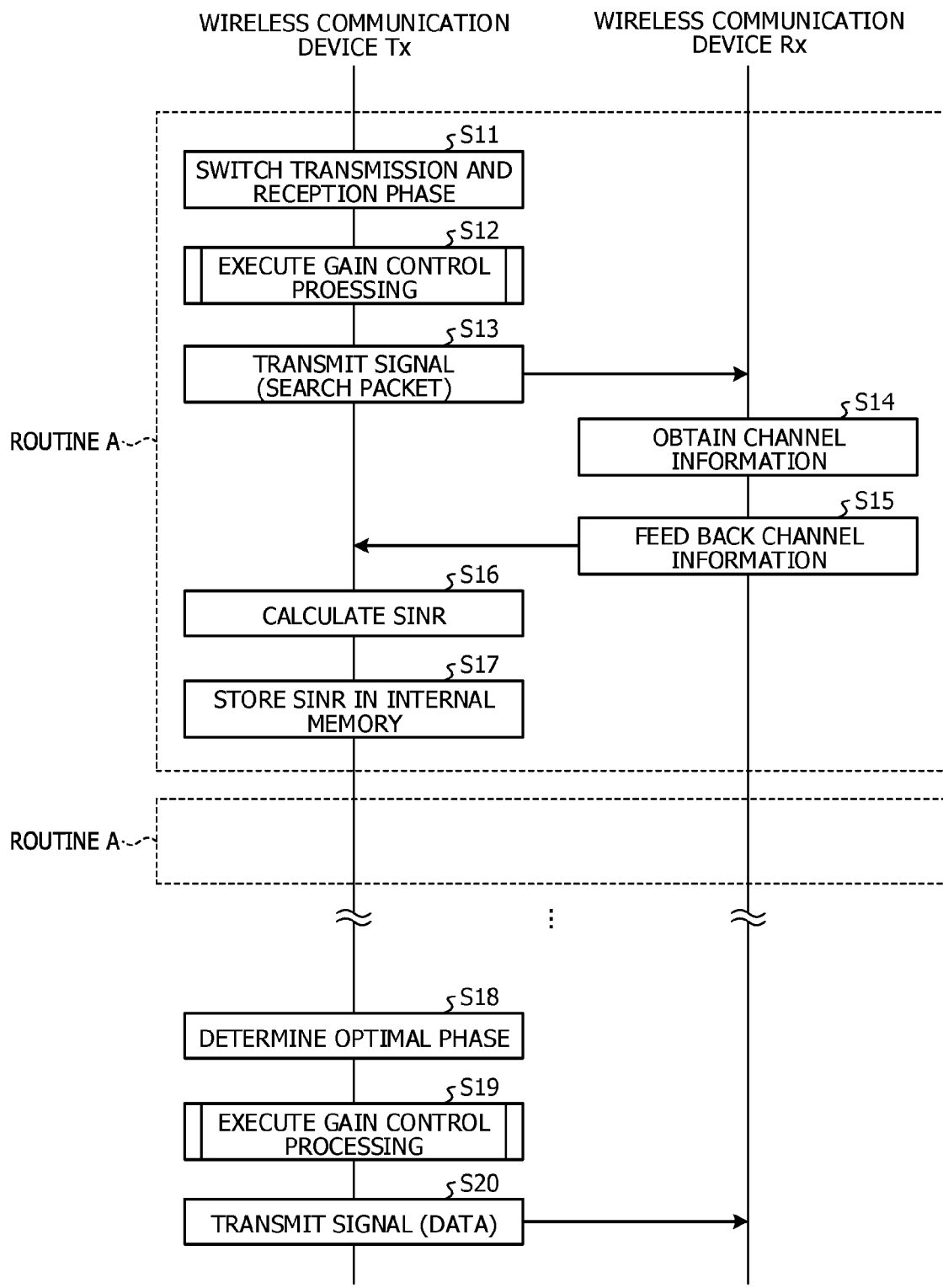
FIG. 6 is a sequence diagram illustrating an example of a flow of processing of the wireless communication device according to the first embodiment.

FIG. 6 is a sequence diagram illustrating an example of the flow of the processing of the wireless communication device according to the first embodiment. In FIG. 6, it is assumed that "wireless communication device Tx" corresponds to a wireless communication device 1 on the transmission side, and "wireless communication device Rx" corresponds to a wireless communication device 1 on the reception side.

The communication quality measurement unit 181 of the wireless communication device Tx switches the transmission and reception phase (Step S11). The communication quality measurement unit 181 notifies the gain control unit 182 of the transmission and reception phase that has been obtained by the switching.

The gain control unit 182 of the wireless communication device Tx executes gain control processing (Step S12). The gain control processing is processing in which gains of two VGAs or three or more VGAs in the phase shifter 11 are set as set gains. The detail of the gain control processing is described later.

The communication quality measurement unit 181 of the wireless communication device Tx causes the BB processing unit 16 to generate a search packet used to search for the wireless communication device on the other side, as a transmission signal. The generated search packet is transmitted from the wireless communication device Tx to the wireless communication device Rx (Step S13).

The communication quality measurement unit 181 of the wireless communication device Rx receives the search packet. The communication quality measurement unit 181 performs channel estimation using the received search packet and obtains channel information (Step S14). The obtained channel information is fed back from the wireless communication device Rx to the wireless communication device Tx (Step S15).

When the channel information is fed back to the wireless communication device Tx, the communication quality measurement unit 181 of the communication quality measurement unit 181 calculates an SINR that is a communication quality using the channel information (Step S16). The communication quality measurement unit 181 associates the SINR with the transmission phase that has been switched in Step S11, and stores the SINR and the transmission phase in the internal memory (Step S17). A routine A that is a series of pieces of processing including Steps S11 to S17 is repeated by the certain number of times. As a result, the communication quality measurement unit 181 of the wireless communication device Tx measures a SINR for each of the plurality of transmission and reception phases.

The gain control unit 182 of the wireless communication device Tx determines a transmission and reception phase having the most excellent communication quality as an optimal phase, with reference to the internal memory of the communication quality measurement unit 181 (Step S18).

The gain control unit 182 of the wireless communication device Tx executes the gain control processing (Step S19). The gain control processing is processing in which gains of two VGAs or three or more VGAs in the phase shifter 11 are set as set gains. The detail of the gain control processing is described later.

The BB processing unit 16 of the wireless communication device Tx generates a data packet as a transmission signal. The generated data packet is transmitted from the wireless communication device Tx to the wireless communication device Rx (Step S20).

Figure 7:
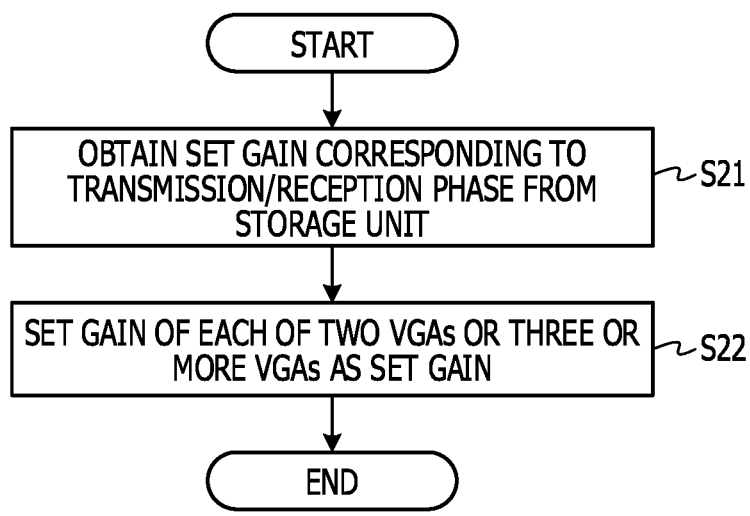
FIG. 7 is a flowchart illustrating an example of a flow of gain control processing in the first embodiment.

FIG. 7 is a flowchart illustrating an example of the gain control processing in the first embodiment. The gain control processing illustrated in FIG. 7 corresponds to the processing in Steps S12 and S19 illustrated in FIG. 6.

As illustrated in FIG. 7, the gain control unit 182 obtains gains corresponding to the transmission and reception phase (or the optimal phase) from the storage unit 17, as the set gains (Step S21).

The gain control unit 182 sets the gains of the two VGAs or the three or more VGAs in the phase shifter 11, as the set gains (Step S22).

As described above, the wireless communication device 1 according to the embodiment sets gains of the two VGAs or the three VGAs in the phase shifter 11 as the set gains so that the phase of an output signal exists within a certain phase range. Here, the certain phase range is a phase range that is sandwiched by the phases of two signals respectively amplified by certain two VGAs, from among the VGAs 123 to 128, and does not reach the two signals. Therefore, an output signal that exists in the certain phase range is generated so that the gain of one of the VGAs is not significantly increased for the gain of the other VGA, from among the two VGAs that respectively amplify the two signals. As a result, in the wireless communication device 1 according to the embodiment, the control width of the gains respectively set to the plurality of VGAs provided in the vector synthesis type phase shifter 1 is suppressed. Specifically, the suppression of the control width of the gains respectively set to the plurality of VGAs attributes to widening of bandwidth of an output signal from the phase shifter under a communication environment in which a so-called Gain Band width (GB) product is maintained to be fixed.

Second Embodiment

Figure 8:
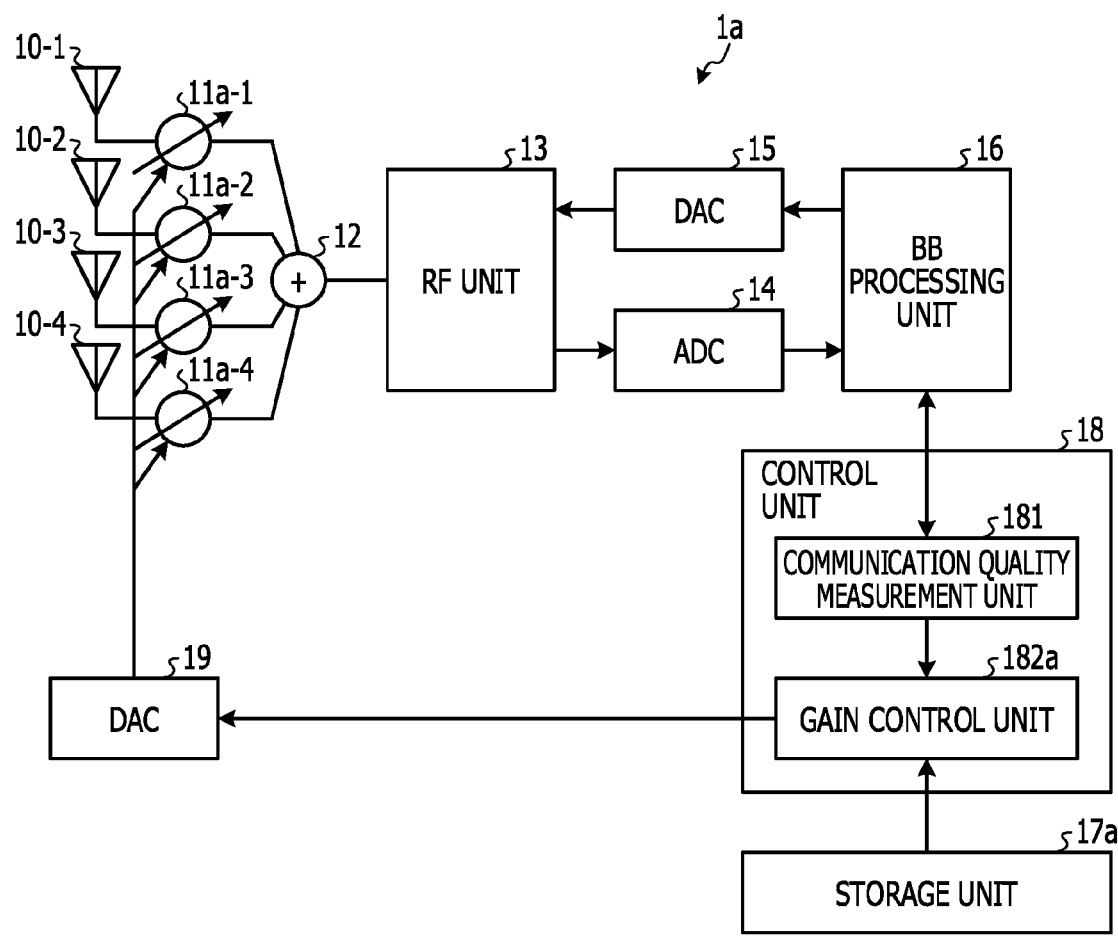
FIG. 8 is a diagram illustrating a configuration example of a wireless communication device according to a second embodiment.

FIG. 8 is a diagram illustrating a configuration example of a wireless communication device according to a second embodiment. A wireless communication device 1a according to the second embodiment is different from the wireless communication device 1 according to the first embodiment in that eight VGAs are provided in a phase shifter. Therefore, in the following embodiment, the configuration of the phase shifter and the gain control of the VGAs in the phase shifter are mainly described. Here, in FIG. 8, it is assumed that each unit having the same symbol as FIG. 1 has a similar function unless otherwise stated.

As illustrated in FIG. 8, the wireless communication device 1a according to the second embodiment includes phase shifters 11a-1 to 11a-4, instead of the phase shifters 11-1 to 11-4 illustrated in FIG. 1. In addition, the wireless communication device 1a includes a storage unit 17a, instead of the storage unit 17 illustrated in FIG. 1. In addition, the wireless communication device is includes a gain control unit 182a, instead of the gain control unit 182 illustrated in FIG. 1.

The configurations and functions between the phase shifters 11a-1 to 11a-4 are similar, so that, in the following description, the phase shifter is referred to as "phase shifter 11a" unless particularly distinguished.

The phase shifter 11a includes eight VGAs, and combines outputs from some VGAs in each of which the gain is set, from among the eight VGAs, to generate an output signal having a certain phase. The phase shifter 11a outputs the generated output signal to the corresponding antenna 10 or the combiner 12.

Figure 9:
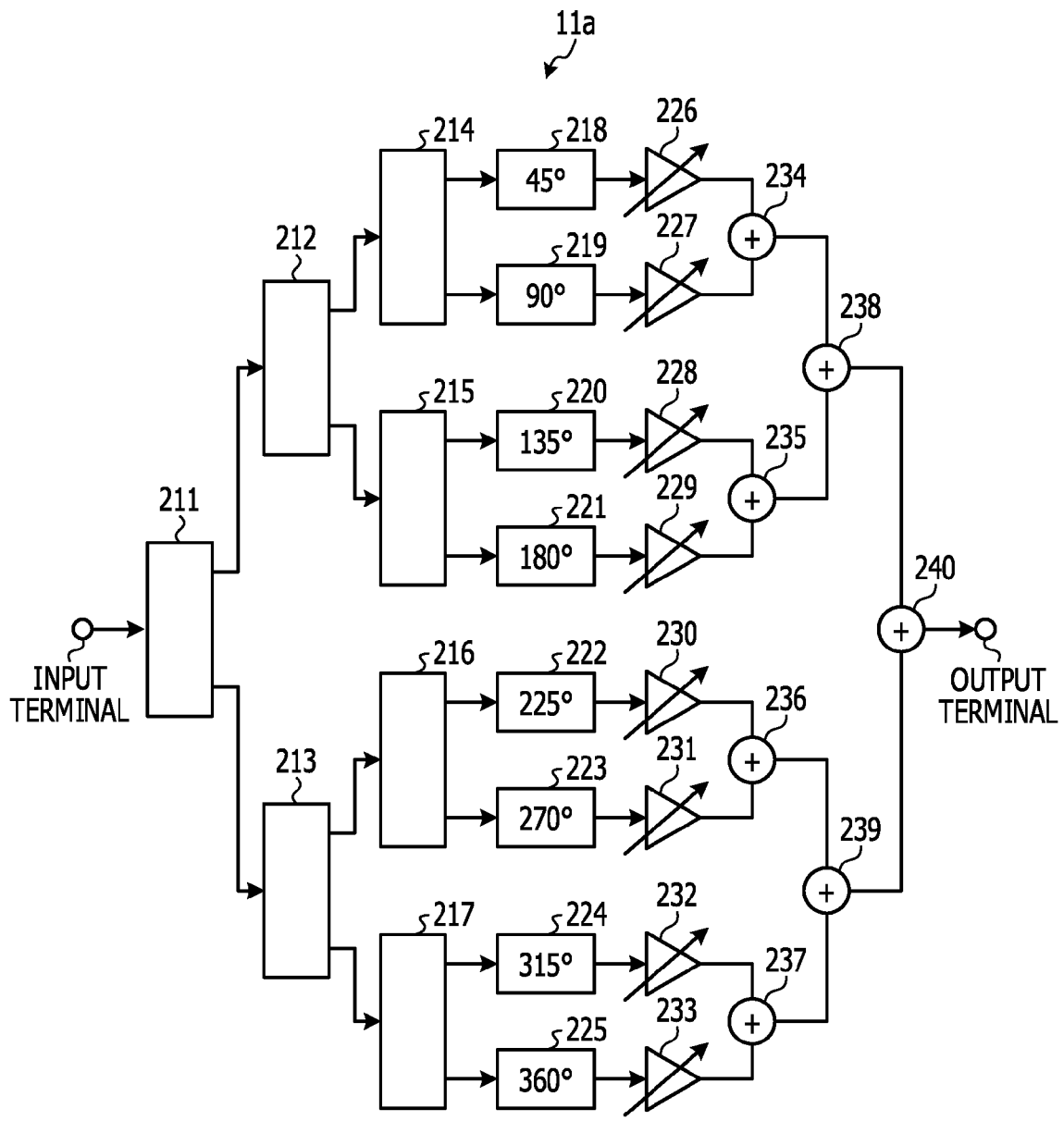
FIG. 9 is a diagram illustrating a configuration example of a phase shifter according to the second embodiment.

FIG. 9 is a diagram illustrating a configuration example of the phase shifter according to the second embodiment. As illustrated in FIG. 9, the phase shifter 11a includes distributors 211 to 217, delay units 218 to 225, VGAs 226 to 233, and combiners 234 to 240.

The distributor 211 divides an input signal from an input terminal, into two signals, outputs one of the two signals that have been obtained through the dividing, to the distributor 212, and outputs the other signal, to the distributor 213. Here, it is assumed that the input terminal may be connected to the corresponding antenna 10 or the combiner 12 selectively. The distributor 212 divides the signal from the distributor 211, into two signals, outputs one of the two signals that have been obtained through the dividing, to a distributor 214, and outputs the other signal, to the distributor 215. The distributor 213 divides the signal from the distributor 211, into two signals, outputs one of the two signals that have been obtained through the dividing, to a distributor 216, and outputs the other signal, to a distributor 217. The distributor 214 divides the signal from the distributor 212, into two signals, outputs one of the two signals that have been obtained through the dividing, to a delay unit 218, and outputs the other signal, to a delay unit 219. The distributor 215 divides the signal from the distributor 212, into two signals, outputs one of the two signals that have been obtained through the dividing, to a delay unit 220, and outputs the other signal, to a delay unit 221. The distributor 216 divides the signal from the distributor 213, into two signals, outputs one of the two signals that have been obtained through the dividing, to a delay unit 222, and outputs the other signal, to a delay unit 223. The distributor 217 divides the signal from the distributor 213, into two signals, outputs one of the two signals that have been obtained through the dividing, to a delay unit 224, and outputs the other signal, to a delay unit 225.

The delay unit 218 generates a signal the phase of which is 45° (hereinafter referred to as "45° signal") by delaying the signal from the distributor 214, and outputs the 45° signal to the VGA 226. The delay unit 219 generates a signal the phase of which is 90° (hereinafter referred to as "90° signal") by delaying the signal from the distributor 214, and outputs the 90° signal to the VGA 227. The delay unit 220 generates a signal the phase of which is 135° (hereinafter referred to as "135° signal") by delaying the signal from the distributor 215, and outputs the 135° signal to the VGA 228. The delay unit 221 generates a signal the phase of which is 180° (hereinafter referred to as "180° signal") by delaying the signal from the distributor 215, and outputs the 180° signal to the VGA 229. The delay unit 222 generates a signal the phase of which is 225° (hereinafter referred to as "225° signal") by delaying the signal from the distributor 216, and outputs the 225° signal to the VGA 230. The delay unit 223 generates a signal the phase of which is 270° (hereinafter referred to as "270° signal") by delaying the signal from the distributor 216, and outputs the 270° signal to the VGA 231. The delay unit 224 generates a signal the phase of which is 315° (hereinafter referred to as "315° signal") by delaying the signal from the distributor 217, and outputs the 315° signal to the VGA 232. The delay unit 225 generates a signal the phase of which is 360° (hereinafter referred to as "360° signal") by delaying the signal from the distributor 217, and outputs the 360° signal to the VGA 233.

The VGA 226 is a variable gain amplifier. The VGA 226 receives a VGA control signal used to set the gain as set gain, from the gain control unit 182a of the control unit 18. In addition, when the VGA 226 has received the VGA control signal, the VGA 226 sets the gain of the VGA 226 as the set gain that has been specified by the VGA control signal. The VGA 226 receives an input of the 45° signal from the delay unit 218. In addition, the VGA 226 amplifies the 45° signal by the set gain that has been specified by the VGA control signal, and outputs the amplified 45° signal to a combiner 234. When the set gain is not specified by the VGA control signal, the VGA 226 stops the operation of the VGA 226 and does not output the 45° signal to the combiner 234.

The VGA 227 is a variable gain amplifier. The VGA 227 receives a VGA control signal used to set the gain as a set gain, from the gain control unit 182a of the control unit 18. In addition, when the VGA 227 has received the VGA control signal, the VGA 227 sets the gain of the VGA 227 as the set gain that has been specified by the VGA control signal. The VGA 227 receives an input of the 90° signal from the delay unit 219. In addition, the VGA 227 amplifies the 90° signal by the set gain that has been specified by the VGA control signal, and outputs the amplified 90° signal to the combiner 234. When the set gain is not specified by the VGA control signal, the VGA 227 stops the operation of the VGA 227, and does not output the 90° signal to the combiner 234.

The VGA 228 is a variable gain amplifier. The VGA 228 receives a VGA control signal used to set the gain as a set gain, from the gain control unit 182a of the control unit 18. In addition, when the VGA 228 has received the VGA control signal, the VGA 228 sets the gain of the VGA 228 as the set gain that has been specified by the VGA control signal. The VGA 228 receives an input of the 135° signal from the delay unit 220. In addition, the VGA 228 amplifies the 135° signal by the set gain that has been specified by the VGA control signal, and outputs the amplified 135° signal to a combiner 235. When the set gain is not specified by the VGA control signal, the VGA 228 stops the operation of the VGA 228, and does not output the 135° signal to the combiner 235.

The VGA 229 is a variable gain amplifier. The VGA 229 receives a VGA control signal used to set the gain as a set gain, from the gain control unit 182a of the control unit 18. In addition, when the VGA 229 has received the VGA control signal, the VGA 229 sets the gain of the VGA 229 as the set gain that has been specified by the VGA control signal. The VGA 229 receives an input of the 180° signal from the delay unit 221. In addition, the VGA 229 amplifies the 180° signal by the set gain that has been specified by the VGA control signal, and outputs the amplified 180° signal to the combiner 235. When the set gain is not specified by the VGA control signal, the VGA 229 stops the operation of the VGA 229, and does not output the 180° signal to the combiner 235.

The VGA 230 is a variable gain amplifier. The VGA 230 receives a VGA control signal used to set the gain as a set gain, from the gain control unit 182a of the control unit 18. In addition, when the VGA 230 has received the VGA control signal, the VGA 230 sets the gain of the VGA 230 as the set gain that has been specified by the VGA control signal. The VGA 230 receives an input of the 225° signal from the delay unit 222. In addition, the VGA 230 amplifies the 225° signal by the set gain that has been specified by the VGA control signal, outputs the amplified 225° signal to a combiner 236. When the set gain is not specified by the VGA control signal, the VGA 230 stops the operation of the VGA 230, and does not output the 225° signal to the combiner 236.

The VGA 231 is a variable gain amplifier. The VGA 231 receives a VGA control signal used to set the gain as a set gain, from the gain control unit 182a of the control unit 18. In addition, when the VGA 231 has received the VGA control signal, the VGA 231 sets the gain of the VGA 231 as the set gain that has been specified by the VGA control signal. The VGA 231 receives an input of the 270° signal from the delay unit 223. In addition, the VGA 231 amplifies the 270° signal by the set gain that has been specified by the VGA control signal, and outputs the amplified 270° signal to the combiner 236. When the set gain is not specified by the VGA control signal, the VGA 231 stops the operation of the VGA 231, and does not output the 270° signal to the combiner 236.

The VGA 232 is a variable gain amplifier. The VGA 232 receives a VGA control signal used to set the gain as a set gain, from the gain control unit 182a of the control unit 18. In addition, when the VGA 232 has received the VGA control signal, the VGA 232 sets the gain of the VGA 232 as the set gain that has been specified by the VGA control signal. The VGA 232 receives an input of the 315° signal from the delay unit 224. In addition, the VGA 232 amplifies the 315° signal by the set gain that has been specified by the VGA control signal, and outputs the amplified 315° signal to a combiner 237. When the set gain is not specified by the VGA control signal, the VGA 232 stops the operation of the VGA 232, and does not output the 315° signal to the combiner 237.

The VGA 233 is a variable gain amplifier. The VGA 233 receives a VGA control signal used to set the gain as a set gain, from the gain control unit 182a of the control unit 18. In addition, when the VGA 233 has received the VGA control signal, the VGA 233 sets the gain of the VGA 233 as the set gain that has been specified by the VGA control signal. The VGA 233 receives an input of the 360° signal from the delay unit 225. In addition, the VGA 233 amplifies the 360° signal by the set gain that has been specified by the VGA control signal, and outputs the amplified 360° signal to the combiner 237. When the set gain is not specified by the VGA control signal, the VGA 233 stops the operation of the VGA 233, and does not output the 360° signal to the combiner 237.

The combiner 234 receives an input of the 45° signal that has been amplified by the VGA 226, from the VGA 226. The combiner 234 receives an input of the 90° signal that has been amplified by the VGA 227, from the VGA 227. When the combiner 234 receives both of the inputs of the 45° signal and the 90° signal, the combiner 234 combines the 45° signal and the 90° signal to generate an output signal that is a vector sum of the 45° signal and the 90° signal, and outputs the generated output signal to a combiner 238. In addition, when the combiner 234 receives merely one of inputs of the 45° signal that has been amplified by the VGA 226 and the 90° signal that has been amplified by the VGA 227, the combiner 234 outputs the received signal to the combiner 238, as an output signal.

The combiner 235 receives an input of the 135° signal that has been amplified by the VGA 228, from the VGA 228. The combiner 235 receives an input of the 180° signal that has been amplified by the VGA 229, from the VGA 229. When the combiner 235 receives both of the inputs of the 135° signal and the 180° signal, the combiner 235 combines the 135° signal and the 180° signal to generate an output signal that is a vector sum of the 135° signal and the 180° signal, and outputs the generated output signal to the combiner 238. In addition, when the combiner 235 receives merely one of inputs of the 135° signal that has been amplified by the VGA 228 and the 180° signal that has been amplified by the VGA 229, the combiner 235 outputs the received signal to the combiner 238, as an output signal.

The combiner 236 receives an input of the 225° signal that has been amplified by the VGA 230, from the VGA 230. The combiner 236 receives an input of the 270° signal that has been amplified by the VGA 231, from the VGA 231. When the combiner 236 receives both of the inputs of the 225° signal and the 270° signal, the combiner 236 combines the 225° signal and the 270° signal to generate an output signal that is a vector sum of the 225° signal and the 270° signal, and outputs the generated output signal to a combiner 239. In addition, when the combiner 236 receives merely one of the inputs of the 225° signal that has been amplified by the VGA 230 and the 270° signal that has been amplified by the VGA 231, the combiner 236 outputs the received signal to the combiner 239, as an output signal.

The combiner 237 receives an input of the 315° signal that has been amplified by the VGA 232, from the VGA 232. The combiner 237 receives an input of the 360° signal that has been amplified by the VGA 233, from the VGA 233. When the combiner 237 receives both of the inputs of the 315° signal and the 360° signal, the combiner 237 combines the 315° signal and the 360° signal to generate an output signal that is a vector sum of the 315° signal and the 360° signal, and outputs the generated output signal to the combiner 239. In addition, when the combiner 237 receives merely one of the inputs of the 315° signal that has been amplified by the VGA 232 and the 360° signal that has been amplified by the VGA 233, the combiner 237 outputs the received signal to the combiner 239, as an output signal.

The combiner 238 receives an input of the output signal from the combiner 234. The combiner 238 receives an input of the output signal from the combiner 235. The combiner 238 combines the output signal from the combiner 234 and the output signal from the combiner 235 to generate an output signal that is a vector sum of the output signals, and outputs the generated output signal to a combiner 240.

The combiner 239 receives an input of the output signal from the combiner 236. The combiner 239 receives an input of the output signal from the combiner 237. The combiner 239 combines the output signal of the combiner 236 and the output signal of the combiner 237 to generate an output signal that is a vector sum of the output signals, and outputs the generated output signal to the combiner 240.

The combiner 240 receives an input of the output signal from the combiner 238. The combiner 240 receives an input of the output signal from the combiner 239. The combiner 240 combines the output signal from the combiner 238 and the output signal from the combiner 239 to generate an output signal that is a vector sum of the output signals, and output the generated output signal to an output terminal. Here, it is assumed that the output terminal may be connected to the corresponding antenna 10 or the combiner 12 selectively. The phase of the output signal output from the combiner 240 is changed within the phase range of 0° to 360° so that gain of each of some VGAs from among the VGAs 226 to 233 is controlled by the VGA control signal.

Returning to FIG. 8, the storage unit 17a associates the phase of an output signal with the gains of the two VGAs or the three or more VGAs including the two VGAs from among the VGAs 226 to 233, and stores the phase and the gains so that the phase of the output signal exists in a certain phase range. Here, the certain phase range is a phase range that is sandwiched by two signals respectively amplified by the certain two VGAs from among the VGAs 226 to 233, and does not reach the two signals.

FIG. 10 is a diagram illustrating a relationship between a certain phase range in the second embodiment and phases of two signals that sandwich the certain phase range. As illustrated in FIG. 10, as the certain phase range, there exist that the phase ranges of 22.5° to 67.5°, 67.5° to 112.5°, 112.5° to 157.5°, 157.5° to 202.5°, and 202.5° to 247.5°. In addition, as the certain phase range, there exist that the phase ranges of 247.5° to 292.5°, 292.5° to 337.5°, and 337.5° to 22.5°. From among these phase ranges, the phase range of 22.5° to 67.5° is a phase range that is sandwiched by the phases of the 360° signal and the 90° signal respectively amplified by the two VGAs 233 and 227, and does not reach the two signals. In addition, the phase range of 67.5° to 112.5° is a phase range that is sandwiched by the phases of the 45° signal and the 135° signal respectively amplified by the two VGAs 226 and 228, and does not reach the two signals. In addition, the phase range of 112.5° to 157.5° is a phase range that is sandwiched by phases of the 90° signal and the 180° signal respectively amplified by the two VGAs 227 and 229, and does not reach the two signals. In addition, the phase range of 157.5° to 202.5° is a phase range that is sandwiched by the phases of the 135° signal and the 225° signal respectively amplified by the two VGAs 228 and 230, and does not reach the two signals. In addition, the phase range of 202.5° to 247.5° is a phase range that is sandwiched by the phases of the 180° signal and the 270° signal respectively amplified by the two VGAs 229 and 231, and does not reach the two signals. In addition, the phase range of 247.5° to 292.5° is a phase range that is sandwiched by the phases of the 225° signal and the 315° signal respectively amplified by the two VGAs 230 and 232, and does not reach the two signals. In addition, the phase range of 292.5° to 337.5° is a phase range that is sandwiched by the phases of the 270° signal and the 360° signal respectively amplified by the two VGAs 231 and 233, and does not reach the two signals. In addition, the phase range of 337.5° to 22.5° is a phase range that is sandwiched by the phases of the 315° signal and the 45° signal respectively amplified by the two VGAs 232 and 226, and does not reach the two signals. The storage unit 17a associates the phase of an output signal with gains of two VGAs or threes VGA including the two VGAs, and stores the phase and the gains so that the phase of the output signal exist in the corresponding phase range of the eight certain phase ranges as illustrated in FIG. 10.

In addition, the storage unit 17a associates the phase of the output signal, which exists in the central area of a certain phase range with the gains of the two VGAs and stores the phase and the gains, and associates the phase of the output signal that exists in the end areas that sandwich the central area of the certain phase range with the gains of the three VGAs and stores the phase and the gains.

In addition, each of the gains of the two VGAs or the three or more VGAs stored in the storage unit 17a is defined in advance so that the amplitude of the output signal generated by the phase shifter 11a is fixed.

The gain control unit 182a obtains set gains that are gains corresponding to the transmission and reception phase, from the storage unit 17a, and sets each of the gains of the two VGAs or the three or more VGAs in the phase shifter 11a as the set gain. For example, the gain control unit 182a obtains the set gain corresponding to the transmission and reception phase notified from the communication quality measurement unit 181, from the storage unit 17a, and generates VGA control signals used to notify the two VGAs or the three or more VGAs in the phase shifter 11a of the obtained set gain, respectively. In addition, the gain control unit 182a outputs the generated VGA control signals to the DAC 19.

Figure 11:
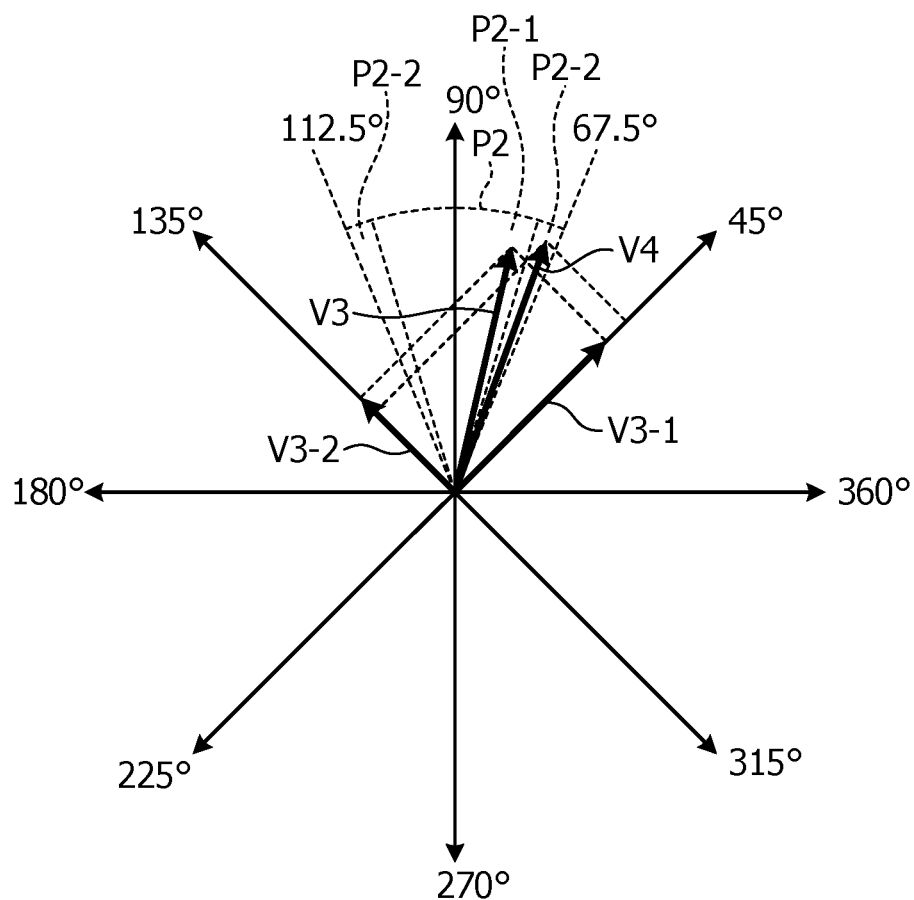
FIG. 11 is a diagram illustrating an example of processing by a gain control unit according to the second embodiment.

An example of processing by the gain control unit 182a is described below with reference to FIG. 11. FIG. 11 is a diagram illustrating the example of the processing by the gain control unit according to the second embodiment. In FIG. 11, the arrow corresponding to 45° indicates a vector of the 45° signal amplified by the VGA 226. In addition, the arrow corresponding to 90° indicates a vector of the 90° signal amplified by the VGA 227. In addition, the arrow corresponding to 135° indicates a vector of the 135° signal amplified by the VGA 228. In addition, the arrow corresponding to 180° indicates a vector of the 180° signal amplified by the VGA 229. In addition, the arrow corresponding to 225° indicates a vector of the 225° signal amplified by the VGA 230. In addition, the arrow corresponding to 270° indicates a vector of the 270° signal amplified by the VGA 231. In addition, the arrow corresponding to 315° indicates a vector of the 315° signal amplified by the VGA 232. In addition, the arrow corresponding to 360° indicates a vector of the 360° signal amplified by the VGA 233.

In addition, in FIG. 11, as an example of the certain phase range, a phase range P2 of 67.5° to 112.5° is illustrated which is sandwiched by the phases of the 45° signal and the 135° signal respectively amplified by the VGAs 226 and 228 from among the VGAs 226 to 233, and does not reach the two signals. In addition, in FIG. 11, a central area P2-1 of the phase range P2 and end areas P2-2 that sandwich the central area P2-1 of the phase range P2 are illustrated.

The gain control unit 182a obtains set gains that are gains corresponding to the transmission and reception phase notified from the communication quality measurement unit 181, from the storage unit 17a, and sets the gains of the two VGAs or the three or more VGAs in the phase shifter 11a, as the set gains. For example, the gain control unit 182a executes the following processing when the notified transmission and reception phase exists in the central area P2-1 of the phase range P2. That is, the gain control unit 182a obtains the set gains of the VGAs 226 and 228 corresponding to the notified transmission and reception phase, from the storage unit 17a, and sets the gains of the VGAs 226 and 228 in the phase shifter 11a, as the set gains. As a result, as illustrated in FIG. 11, an output V3-1 of the VGA 226 in which the gain has been set as the set gain and an output V3-2 of the VGA 228 in which the gain has been set as the set gain are combined to generate an output signal V3 that exists in the central area P2-1 of the phase range P2.

In addition, for example, the gain control unit 182a executes the following processing when the notified transmission and reception phase exists in the end areas P2-2 of the phase range P2. That is, the gain control unit 182a obtains the set gains of the three VGAs including the VGAs 226 and 228 corresponding to the notified transmission and reception phase, from the storage unit 17a, and sets each of the gains of the three VGAs in the phase shifter 11a, as the set gain. As a result, as illustrated in FIG. 11, outputs of the three VGAs in each of which the gain has been set as the set gain are combined to generate an output signal V4 that exists in the end areas P2-2 of the phase range P2.

As described above, the wireless communication device 1a according to the embodiment sets gains of the two VGAs or the three VGAs in the phase shifter 11a as the set gains so that the phase of the output signal V3 or the output signal V4 exists in the phase range P2. Here, the phase range P2 is a phase range of 67.5° to 112.5°, which is sandwiched by the phases of the 45° signal and the 135° signal respectively amplified by the VGAs 226 and 228, from among the VGAs 226 to 233, and does not reach the two signals. Therefore, the output signal V3 or the output signal V4 that exists in the phase range of the 67.5° to 112.5° is generated so that the gain of one of the VGAs 226 and 228 that respectively amplify the 45° signal and the 135° signal is not significantly increased for the gain of the other VGA. As a result, in the wireless communication device 1a according to the embodiment, the control width of the gains respectively set to the plurality of VGAs provided in the vector synthesis type phase shifter is suppressed.

In addition, when the phase of the output signal exists in the end areas P2-2 of the phase range P2, the wireless communication device 1a according to the embodiment sets the gains of the three VGAs in the phase shifter 11a as the set gains. Therefore, in the wireless communication device 1a according to the embodiment, a gain difference of the VGAs is further suppressed as compared with a method in which the gains of the VGAs 124 and 128 that respectively amplify the 90° signal and the 330° signal are set as the set gains. As a result, the control width of the gains respectively set to the plurality of VGAs provided in the vector synthesis type phase shifter may be further suppressed.

(Hardware Configuration)

Figure 12:
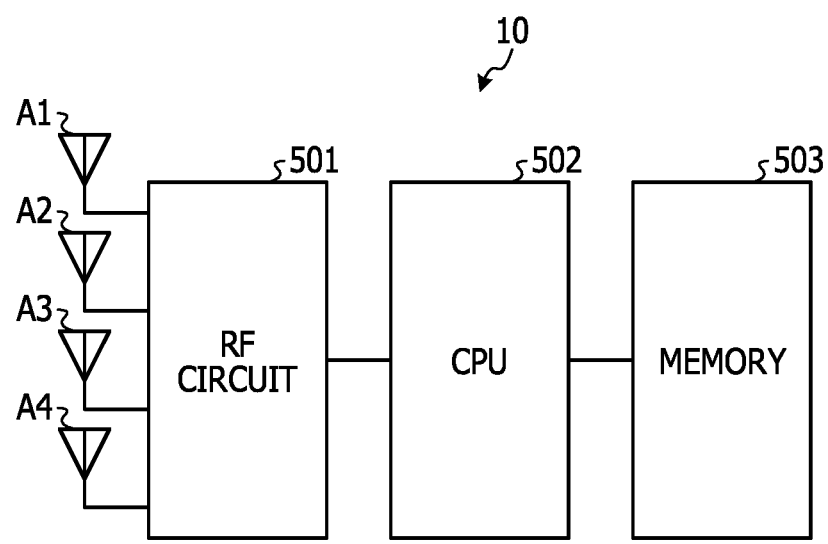
FIG. 12 is a hardware configuration diagram of the wireless communication device.

A hardware configuration example of the wireless communication device 1 is described below with reference to FIG. 12. FIG. 12 is the hardware configuration diagram of the wireless communication device.

As illustrated in FIG. 12, the wireless communication device includes antennas A1 to A4, a RF circuit 501, a CPU 502, and a memory 503. The RF circuit 501 and the memory 503 are connected to the CPU 502.

The antennas A1 to A4 respectively correspond to, for example, the antennas 10-1 to 10-4 illustrated in FIG. 1.

The RF circuit 501 corresponds to, for example, the phase shifters 11-1 to 11-4, the combiner 12, the RF unit 13, the ADC 14, the DAC 15, and the DAC 19 illustrated in FIG. 1.

The memory 503 corresponds to, for example, the storage unit 17 illustrated in FIG. 1.

The CPU 502 and the memory 503 achieve, for example, the functions of the BB processing unit 16, the control unit 18, illustrated in FIG. 1, and the like. For example, the memory 503 stores various programs that achieve pieces of processing by the communication quality measurement unit 181, the gain control unit 182 illustrated in FIG. 1, and the like. In addition, the CPU 502 generates a process that achieves the above-described functions by reading the programs stored in the memory 503 and reading the programs.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless communication device comprising:
a delay circuit configured to receive an input signal to generate four or more delay signals, the four or more delay signals having different phases;
an amplifier circuit configured to amplify the four or more delay signals to generate four or more amplified delay signals; and
a combiner circuit configured to combine at least two amplified delay signals included in the four or more amplified delay signals to generate an output signal, wherein
the four or more amplified delay signals include a first amplified delay signal, a second amplified delay signal and a third amplified delay signal,
a second phase of the second amplified delay signal is between a first phase of the first amplified delay signal and a third phase of the third amplified delay signal,
gains of the amplifier circuit for the four or more delay signals are configured to be controlled such that the output signal is generated by combining the first amplified delay signal and the third amplified delay signal, and
a phase of the output signal is between the first phase of the first amplified delay signal and the third phase of the third amplified delay signal.

2. The wireless communication device according to claim 1, further comprising:
a communication quality measurement circuit configured to switch the phase of the output signal, and to measure a communication quality of a wireless communication using the output signal obtained through the switching; and
a gain control circuit configured to control the gains of the amplifier circuit to control amplitudes of the four or more amplified delay signals individually, wherein
the gain control circuit is further configured to control the gains of the amplifier circuit such that the communication quality measured by the communication quality measurement circuit is improved.

3. The wireless communication device according to claim 1, wherein the phase of the output signal is changeable in a certain phase region which is between the first phase of the first amplified delay signal and the third phase of the third amplified delay signal, the certain phase region does not include the first phase and the third phase.

4. The wireless communication device according to claim 3, wherein
when the phase of the output signal is in a center region of the certain phase region, the output signal is generated by combining the first amplified delay signal and the third amplified delay signal, and
when the phase of the output signal is in boundary regions of the certain phase region, the output signal is generated by combining the first amplified delay signal, the third amplified delay signal and a fourth amplified delay signal included in the four or more amplified delay signals and next to the third amplified delay signal.

5. The wireless communication device according to claim 1, wherein the gain control circuit is further configured to control the gains of the amplifier circuit such that amplitude of the output signal is a constant value.

6. The wireless communication device according to claim 1, wherein adjacent two delay signals each have a predetermined amount of phase angle.

7. The wireless communication device according to claim 6, wherein
the delay circuit is further configured to generate six delay signals, and
the phase angle between two adjacent delay signals is 60°.

8. The wireless communication device according to claim 6, wherein
the delay circuit is further configured to generate eight delay signals, and
the phase angle between two adjacent delay signals is 45°.

9. A control method of a wireless communication device, the control method comprising:
receiving an input signal;
delaying the input signal and generating four or more delay signals, the four or more delay signals having different phases;
amplifying, by an amplifier circuit, the four or more delay signals to generate four or more amplified delay signals; and
combining at least two amplified delay signals included in the four or more amplified delay signals to generate an output signal, wherein
the four or more amplified delay signals include a first amplified delay signal, a second amplified delay signal and a third amplified delay signal,
a second phase of the second amplified delay signal is between a first phase of the first amplified delay signal and a third phase of the third amplified delay signal,
gains of the amplifier circuit for the four or more delay signals are configured to be controlled such that the output signal is generated by combining the first amplified delay signal and the third amplified delay signal, and
a phase of the output signal is between the first phase of the first amplified delay signal and the third phase of the third amplified delay signal.

10. The control method according to claim 9, further comprising:
switching the phase of the output signal and measuring a communication quality of a wireless communication using the output signal obtained through the switching; and
controlling gains of the amplifier circuit to control amplitudes of the four or more amplified delay signals individually, wherein the controlling of the gains of the amplifier circuit is performed so as to improve the communication quality.

11. The control method according to claim 9, wherein the phase of the output signal is changeable in a certain phase region which is between the first phase of the first amplified delay signal and the third phase of the third amplified delay signal, and the certain phase region does not include the first phase and the third phase.

12. The control method according to claim 11, wherein when the phase of the output signal is in a center region of the certain phase region, the output signal is generated by combining the first amplified delay signal and the third amplified delay signal, and when the phase of the output signal is in boundary regions of the certain phase region, the output signal is generated by combining the first amplified delay signal, the third amplified delay signal, and a fourth amplified delay signal included in the four or more amplified delay signals and next to the third amplified delay signal.

13. The control method according to claim 9, wherein the controlling of the gains of the amplifier circuit is performed such that amplitude of the output signal is a constant value.

14. A phase shifter for wireless communications, comprising:
a plurality of delay circuits configured to generate four or more delay signals of an input signal by a predetermined phase amount, the four or more delay signals including a first delay signal and a second delay signal;
a plurality of variable gain amplifiers configured to receive the four or more delay signals respectively from the plurality of delay circuits and to generate amplified delay signals; and
a combiner configured to receive and combine the amplified delay signals to generate an output signal having a certain phase in a phase range enclosed by phases of the first delay signal and the second delay signal,
wherein gains of the plurality of variable gain amplifiers are configured to be controlled so as to reduce a difference between the gains of the variable gain amplifiers that are used in generating the output signal.

15. The phase shifter according to claim 14, wherein the phase shifter comprises a vector synthesis type phase shifter.

16. The phase shifter according to claim 14, wherein
the phase range includes a central region and two boundary regions, and
the phase range does not include the phases of the first and second delay signals.

17. The phase shifter according to claim 16, wherein when the certain phase of the output signal is determined to be in the central region of the phase range, the first delay signal and the second delay signal are used to generate the output signal.

18. The phase shifter according to claim 16, wherein when the certain phase of the output signal is determined to be in either of the two boundary regions of the phase range, the first delay signal, the second delay signal, and a third delay signal included in the four or more delay signals are used to generate the output signal.

19. The phase shifter according to claim 14, wherein the plurality of delay circuits generate six delay signals, and the predetermined phase amount is 60°.

20. The phase shifter according to claim 14, wherein the plurality of delay circuits generate eight delay signals, and the predetermined phase amount is 45°.

* * * * *